(12) United States Patent
Wu et al.

(10) Patent No.: US 11,257,861 B2
(45) Date of Patent: Feb. 22, 2022

(54) SEMICONDUCTOR STRUCTURE AND METHOD OF FORMING THE SAME

(71) Applicant: TAIWAN SEMICONDUCTOR MANUFACTURING COMPANY LTD., Hsinchu (TW)

(72) Inventors: Gao-Ming Wu, Hsinchu (TW); Han-Ting Tsai, Kaoshiung (TW); Chung-Te Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/886,648

(22) Filed: May 28, 2020

(65) Prior Publication Data

US 2021/0375985 A1    Dec. 2, 2021

(51) Int. Cl.
| | |
|---|---|
| *H01L 27/22* | (2006.01) |
| *H01L 43/02* | (2006.01) |
| *H01L 23/522* | (2006.01) |
| *G11C 5/06* | (2006.01) |
| *G11C 5/02* | (2006.01) |

(52) U.S. Cl.
CPC ............ *H01L 27/222* (2013.01); *G11C 5/025* (2013.01); *G11C 5/06* (2013.01); *H01L 23/5226* (2013.01); *H01L 43/02* (2013.01)

(58) Field of Classification Search
CPC ... H01L 27/222; H01L 23/5226; H01L 43/02; G11C 5/025; G11C 5/06
USPC ........................................................ 257/421
See application file for complete search history.

(56) References Cited

U.S. PATENT DOCUMENTS

| | | | | |
|---|---|---|---|---|
| 2005/0287446 | A1* | 12/2005 | Nolscher ................... | G03F 1/30 430/5 |
| 2014/0264668 | A1* | 9/2014 | Lee ........................ | G11C 11/161 257/421 |
| 2021/0065750 | A1* | 3/2021 | Hsu ..................... | G11C 11/1655 |

\* cited by examiner

*Primary Examiner* — Tu-Tu V Ho
(74) *Attorney, Agent, or Firm* — WPAT, P.C., Intellectual Property Attorneys; Anthony King

(57) ABSTRACT

A semiconductor structure, comprising a substrate and an interconnect layer disposed over a substrate and extending across a memory region and a logic region. The interconnect layer comprises a plurality of tower structures disposed in the interconnect layer within the memory region. Each tower structure comprises at least one metal interconnect structure and a magnetic tunnel junction (MTJ) structure stacked on the metal interconnect structure. The plurality of tower structures are arranged on the substrate in a XY staggered pattern. The at least one metal interconnect structure and the magnetic tunnel junction (MTJ) structure in each tower structure are substantially symmetric along a stacking direction.

20 Claims, 24 Drawing Sheets

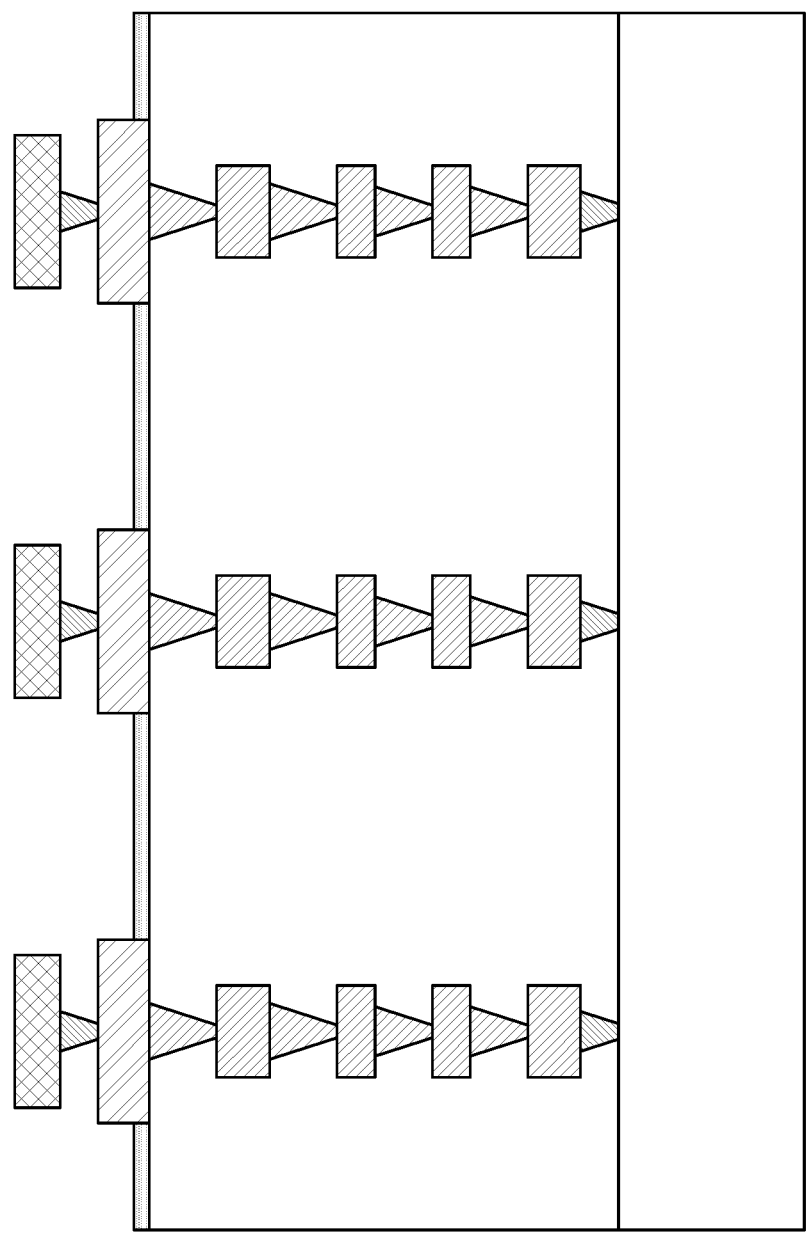

SEMICONDUCTOR STRUCTURE AND METHOD OF FORMING THE SAME

BACKGROUND

Many modern day electronic devices contain electronic memory. Electronic memory may be volatile memory or non-volatile memory. Non-volatile memory is able to retain its stored data in the absence of power, whereas volatile memory loses its stored data when power is lost. Magnetoresistive random-access memory (MRAM) is one promising candidate for next generation non-volatile electronic memory due to advantages over current electronic memory. Compared to current non-volatile memory, such as flash random-access memory, MRAM typically is faster and has better endurance. Compared to current volatile memory, such as dynamic random-access memory (DRAM) and static random-access memory (SRAM), MRAM typically has similar performance and density, but lower power consumption.

An MRAM cell is formed by a magnetic tunneling junction (MTJ), which is a structure in which two ferromagnetic layers are separated by a thin insulating barrier. When a potential difference is applied across the two ferromagnetic layers, current flows through the insulating barrier by quantum mechanical tunneling. The resistance of the MTJ depends on the relative orientation of magnetic elements in the two ferromagnetic layers. The resistance is lowest when the magnetizations are aligned in parallel and highest when they are anti-parallel. One of the relative orientations can be used to represent a "1" and the other to represent a "0." In general, the magnetic orientation of one of the layers (the pinned layer) is kept fixed while the magnetic orientation of the other layer (the free layer) is set in a write operation. The state of the MRAM cell can be queried by measuring the junction's resistance. For an array of MRAM cells to provide reliable data storage, a sufficiently great difference in resistance between the two possible states must be realized for each cell in the array.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5B and 5C are diagrammatic side views of the tower structures shown in FIG. 5A, according to the present disclosure.

DETAILED DESCRIPTION OF THE DISCLOSURE

Figure 1:
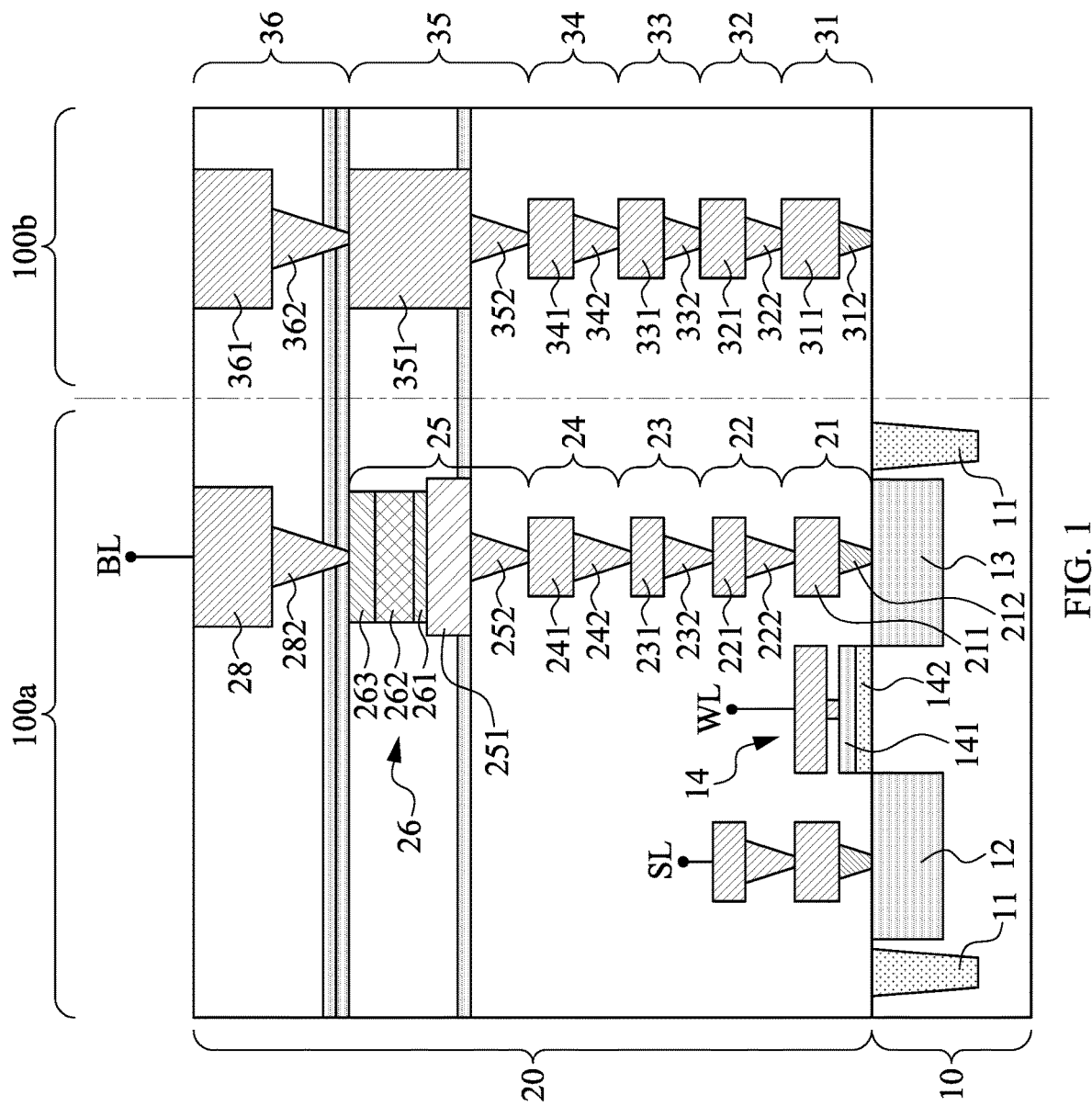
FIG. 1 illustrates a diagrammatic cross-sectional side view of a semiconductor structure having a memory region and a logic region, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

As the size of on-chip components is scaled (i.e., reduced), device "shrinkage" allows engineers to integrate more components and more corresponding functionality onto newer generations of ICs. In recent technology nodes, this has allowed for non-volatile memory to be integrated on an integrated chip with logic devices. For example, a substrate may have a logic region, in which logic devices are formed, and also a memory region, in which magnetic random access memory (MRAM) or resistive random access memory (RRAM) devices are formed. In one example, the memory region may locate at the center of a semiconductor circuit while the logic region may locate at a periphery of the semiconductor circuit. In another example, the memory region may locate at a corner of a semiconductor circuit while the logic region may locate at the remaining area of the semiconductor circuit. Note the previous statement is not intended to be limiting. Other arrangement regarding the memory region and the logic region are enclosed in the contemplated scope of the present disclosure.

Generally, the memory region and the logic region are formed separately, which needs a long process time. To achieve better integration and simplify the method for forming a semiconductor circuit having a memory region and a logic region, a unique and integrated process is needed. Moreover, since semiconductor memory devices are continually shrinking in size, there is also a need to provide a high-density memory cell array to keep fast memory speeds, reliable read/write operations and/or to achieve better performance.

FIG. 1 shows a diagrammatic cross-sectional side view of a semiconductor structure according to some embodiments. An interconnect layer 20 is disposed over a substrate 10 and extends across a memory region 100a and a logic region 100b. In the memory region 100a, a memory array is disposed in the interconnect layer 20, while the logic region 100b are coupled to logic devices, such as transistors formed in the substrate 10, to support operation of the memory cells.

In some embodiments, within the memory region 100a, the substrate 10 may be, for example, a bulk substrate (e.g., a bulk silicon substrate) or a silicon-on-insulator (SOI) substrate. The illustrated embodiment depicts one or more shallow trench isolation (STI) regions 11, which may include a dielectric-filled trench within the substrate 10. A transistor is arranged over the substrate 10 and between the isolation regions 11. The transistor includes a source region 12, a drain region 13, and a gate region 14 including a gate electrode 141 and a gate dielectric 142. A source line (SL) connects to the source region 12 and a word line (WL) for addressing the memory cell is coupled to the gate electrode 142.

Figure 2:
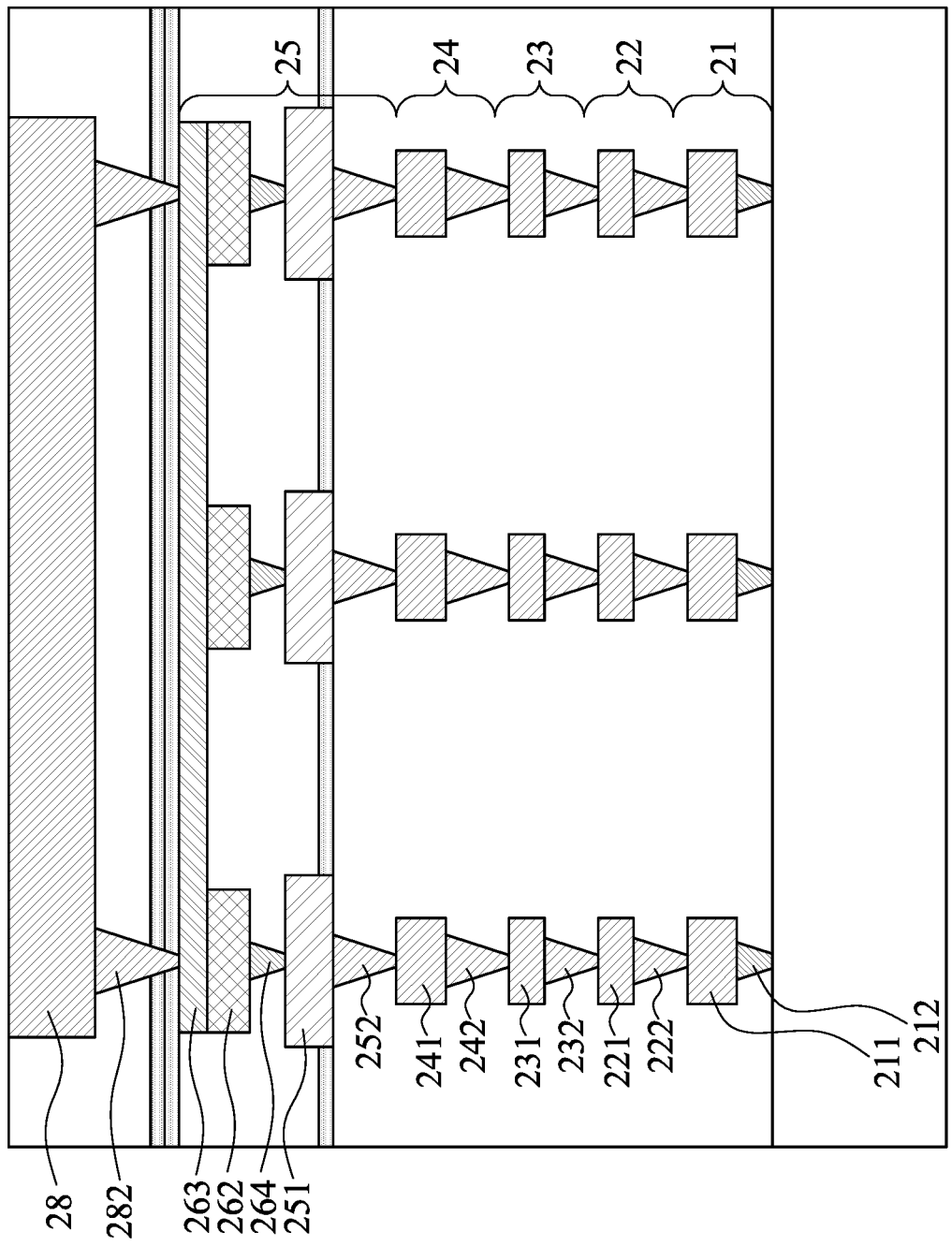
FIG. 2 illustrates a diagrammatic cross-sectional side view of a memory region in a semiconductor structure, according to the present disclosure.

With reference to FIG. 2, in some embodiments, within the memory region 100a, the memory array includes a plurality of tower structures disposed in the interconnect layer 20 and connecting to the drain region 13. Each tower structure comprises at least one metal interconnect structure 21, 22, 23, 24 and 25 and a memory device 26. In some embodiments, the memory device 26 can be a magnetic tunnel junction (MTJ) structure 26. The metal interconnect structure 21, 22, 23, 24 and 25 connects to the drain region 13. In some embodiments, each of the tower structures is electrically connected a drain region 13 shared by two transistors, as shown in FIG. 2, but the disclosure is not limited thereto.

Figure 3:
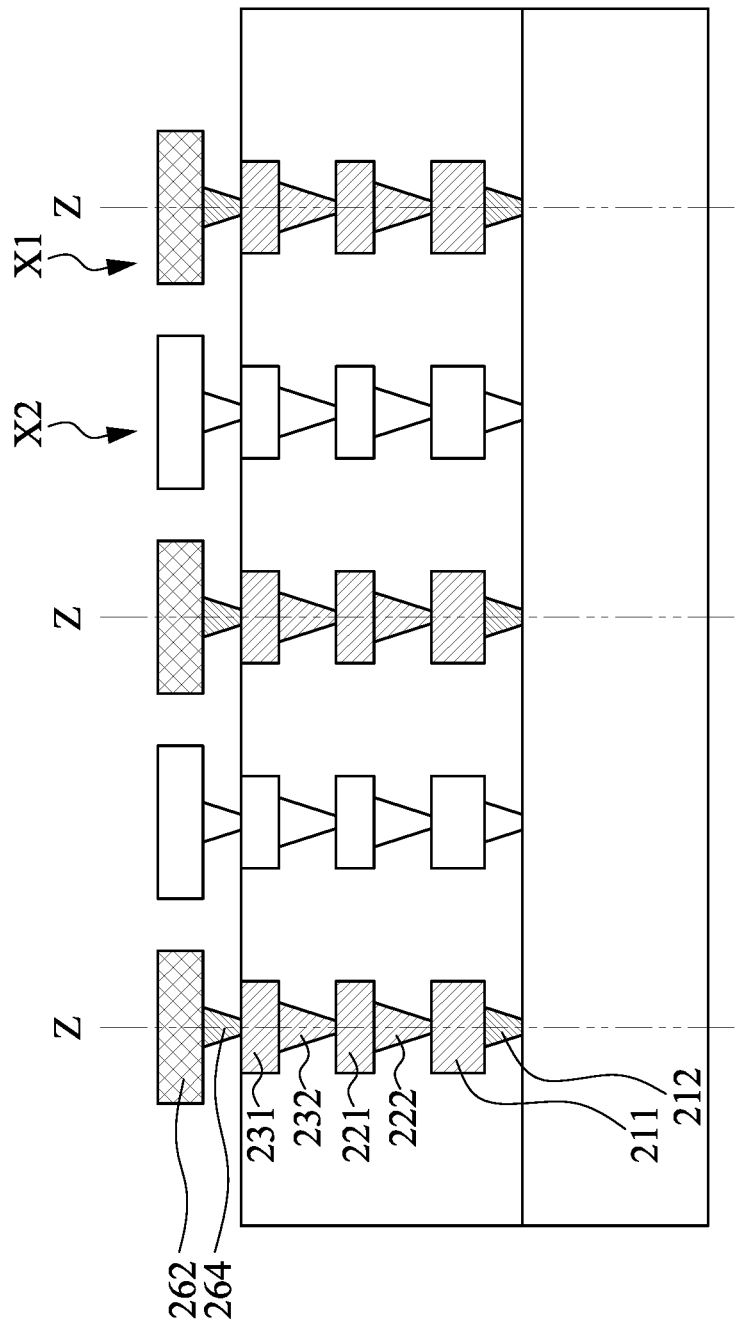
FIG. 3 is a diagrammatic side view of tower structures in a memory region in a semiconductor structure, according to the present disclosure.

The tower structure shown in FIGS. 1 and 2 has first, second, third, fourth and fifth metal interconnect structures 21, 22, 23, 24 and 25 and an MTJ structure 26; and the tower structure shown in FIG. 3 has three metal interconnect structures 21, 22 and 23 and an MTJ structure (not shown). Each metal interconnect structure comprises a metal island and a metal via coupled to the metal island. As illustrated in FIG. 1, the metal interconnect structures 21, 22, 23, 24 and 25 comprise first, second, third, fourth and fifth metal islands 211, 221, 231, 241 and 251 and first, second, third, fourth and fifth metal vias 212, 222, 232, 242, 252, wherein the first, second, third, fourth and fifth metal vias 212, 222, 232, 242, 252 are coupled to the first, second, third and fourth metal islands first, second, third, fourth and fifth metal islands 211, 221, 231, 241 and 251, respectively.

In some embodiments, the metal islands 211, 221, 231, 241 and 251 in each tower structure can be labeled as M0 through M6 and the metal vias in each tower structure can be labeled as V0 through V5. Further, the metal islands M1 through M6 and the metal vias V0 through V5 can be disposed in a plurality of inter-layer dielectric (ILD) and inter-metal dielectric (IMD) layers. The IMD layers provide electrical insulating as well as structural support for the various features during many fabrication operations. For example, the tower structures are separated from each other by the IMD layers. In some embodiments, the inter-metal dielectric layer IMD1 through IMD4 may be formed of low-k dielectric material, for example, with k value lower than about 3.0, and even lower than about 2.5, but the disclosures is not limited to this. In some embodiments, a length and a width of the metal islands in one IMD layer are less than a length and a width of the metal islands in one overlaying IMD layer. Further, in some embodiments, a thickness of the metal islands in one IMD layer are less than a thickness the metal islands in one overlaying IMD layer.

As mentioned above, the memory device, i.e., the MTJ structure 26 can be integrated in each tower structure. For example, the MTJ structure 26 can be integrated over the metal island M4, but the disclosure is not limited to this. In other embodiments, the MTJ structure 26 can be integrated over any of the metal islands Mn, and n is a positive integer. The MTJ structure 26 includes a bottom electrode 261, which may be coupled to the interconnect structures 21, 22, 23, 24 and 25 directly (as shown in FIG. 1) or through a bottom electrode via (BEVA) 264 (as shown in FIGS. 2 and 3), an MTJ stack 262 formed on the bottom electrode 261 and a top electrode 263 formed on the MTJ stack 262, which may be further coupled to an upper metal line 28 as a bit line (BL) through an upper metal via 282. The MTJ stack 262 includes a bottom ferromagnetic layer, a tunnel barrier layer disposed over the bottom ferromagnetic layer, and a top ferromagnetic layer disposed over the tunnel barrier layer. In some embodiments, the bottom electrode 261 and the top electrode 263 may comprise titanium nitride (TiN), tantalum nitride (TaN), tantalum (Ta), titanium (Ti), W, Cu, Mg, Ru, Cr, Co, Fe, Ni, or alloys thereof while the fifth metal via 252 and the upper metal via 282 may comprise copper. It is noted that the top electrode 263 may be a metal line coupled to more than one MTJ stack 262, as shown in FIG. 2. For example, when the tower structures are arranged a XY staggered pattern, the tower structures in a same row can be coupled to a same top electrode 263, but the disclosure is not limited thereto.

With further reference to FIG. 3, which is a diagrammatic side view of tower structures in a memory region 100a. In some embodiments, a single tower structure is substantially symmetric along the stacking direction (that is, the z axis). With reference to FIGS. 1 and 3, in some embodiments, for each tower structure, at least two of the metal islands 211, 221, 231, 241 and 251 and at least two of the metal vias 212, 222, 232, 242, 252 of the interconnect structures 21, 22, 23, 24 and 25 are substantially symmetric along the z axis. In some embodiments, at least one of the metal islands 211, 221, 231, 241 and 251 and the MTJ structure 26 are substantially symmetric along the z axis. In some embodiments, at least one of the metal islands 211, 221, 231, 241 and 251, at least one of the metal vias 212, 222, 232, 242, 252 and the MTJ structure 26 are substantially symmetric along the z axis. In another embodiment, all of the metal islands 211, 221, 231, 241 and 251 and 251, all of the metal vias 212, 222, 232, 242, 252 and the MTJ structure 26 are substantially symmetric along the z axis.

Figure 4:
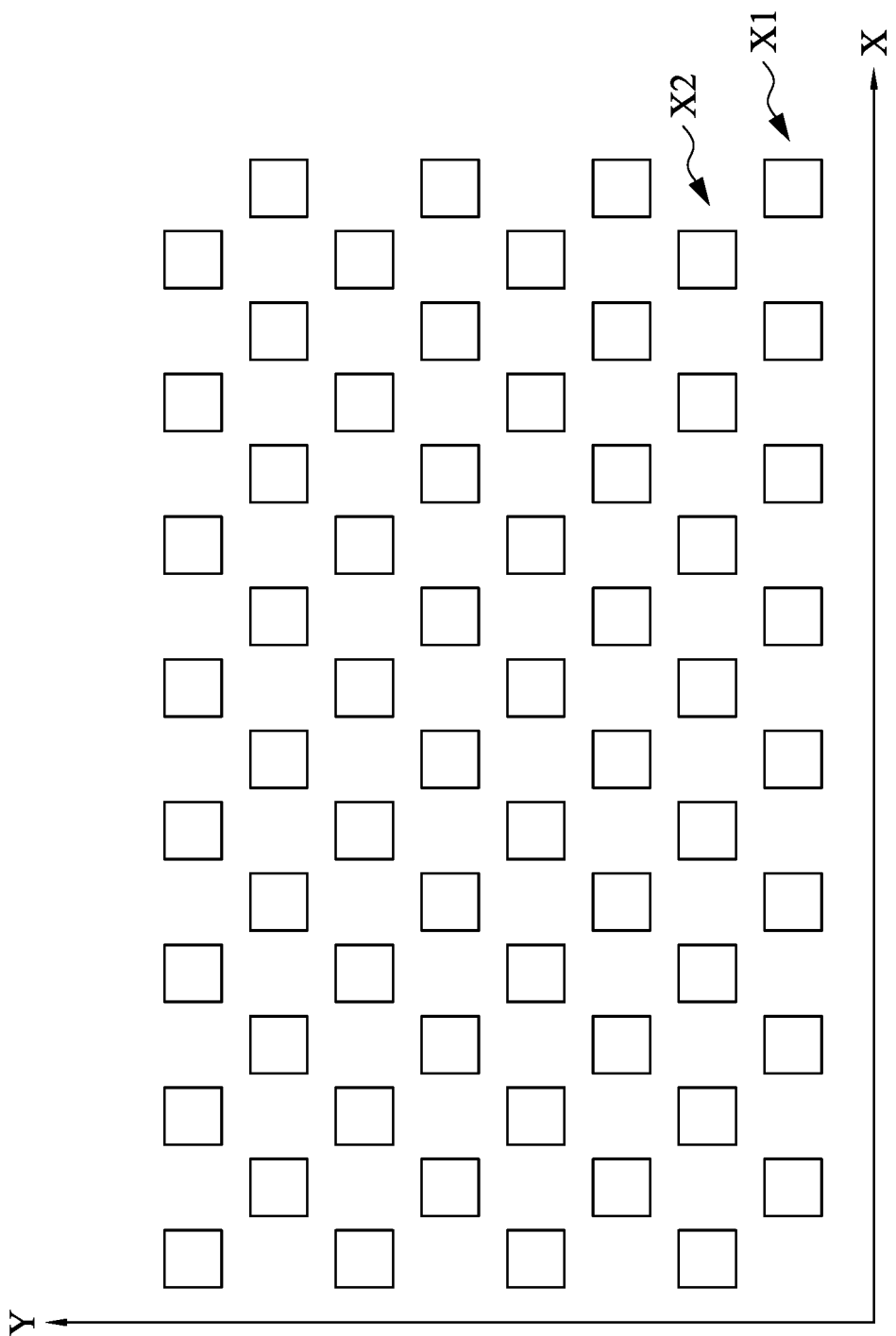
FIG. 4 illustrates a diagrammatic top view of tower structures in a memory region of a semiconductor structure, according to the present disclosure.
Figure 5A:
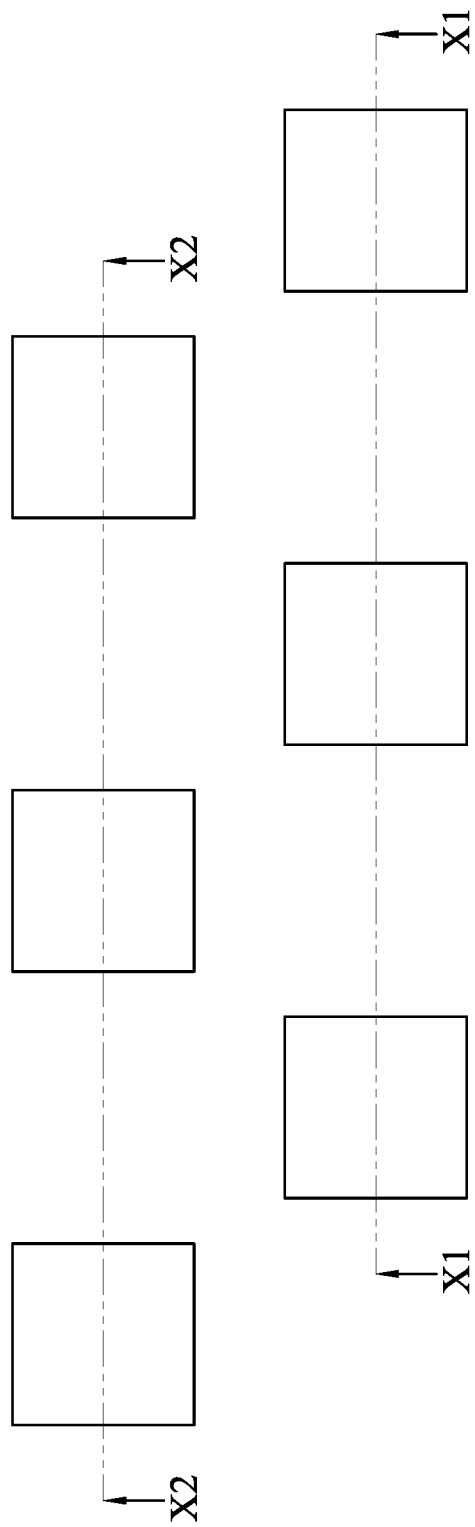
FIG. 5A illustrates a diagrammatic top view of row X1 and row X2 of the tower structures shown in FIG. 4, according to the present disclosure.
Figure 5C:
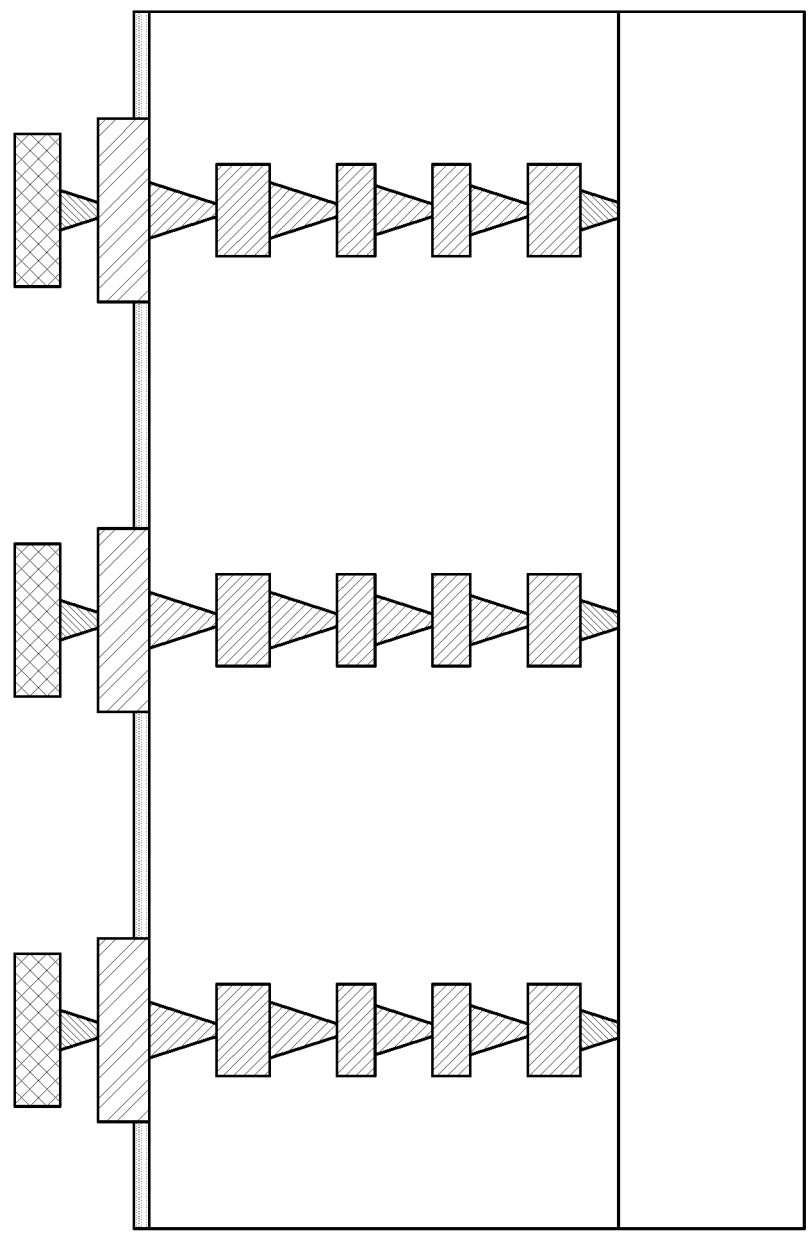

FIG. 4 is a diagrammatic top view of the tower structures. Multiple tower structures are arranged along the x axis to form several rows of tower structures. In some embodiments the tower structures in one row and those in an adjacent row are arranged in a staggered or offset manner. The illustrated embodiment depicts the tower structures arranged in a XY staggered pattern. FIG. 5A is a diagrammatic top view of row X1 and row X2 of the tower structures shown in FIG. 4, in which the tower structures in row X1 and those in row X2 are arranged in a stagger manner. FIGS. 5B and 5C are diagrammatic side views of row X1 and row X2 of the tower structures shown in FIG. 5A. Since row X1 of the tower structures are arranged in front of row X2, from the side view as shown in FIG. 3, the tower structures of row X2 can be observed between the intervals of the tower structures of row X1 due to the staggered arrangement.

Due to the symmetrically stacked tower structure arranged in a staggered manner, more MTJ structures 26 are provided in the memory region 100a, so a high-density memory cell array is present to achieve improved memory capacity. In one embodiment, the pitch between two adjacent tower structures is from about 20 nm to about 300 nm. In another embodiment, the pitch between two adjacent tower structures is from about 50 nm to about 250 nm. In yet another embodiment, the pitch between two adjacent tower structures is from about 75 nm to about 200 nm.

The MTJ structure 26 and metal islands 211, 221, 231, 241 and 251 may have various shapes when viewed from above. For example, the MTJ structure 26 is square in shape as shown in FIG. 4; and in some embodiments, the MTJ structure 26 may have other shapes (e.g., rectangular, circular, elliptical, oval or the like). Also, each of the fourth and fifth metal islands 241, 251 has a square shape; and in some embodiments, the fourth and fifth metal island 241, 251 may have other shapes (e.g., rectangular, circular, elliptical, oval or the like). It is noted that the MTJ structure 26 and the metal islands 211, 221, 231, 241 and 251 may have the same shape in one tower structure or may have different shapes.

With reference back to FIG. 1, the logic region 100b in the interconnect layer 20 comprises a plurality of metal sets 31, 32, 33, 34, 35, 36 stacked on the substrate 10. The illustrated embodiment depicts first to sixth metal sets 31, 32, 33, 34, 35, 36 stacked on the substrate 10. Each metal set 31, 32, 33, 34, 35, 36 comprises a group of metal lines 311, 321, 331, 341, 351, 361 and a group of metal vias 312, 322, 332, 342, 352, 362 coupled to the metal lines 311, 321, 331, 341, 351, 361. In some embodiments, the metal lines 311, 321, 331, 341, 351, 361 and metal vias 312, 322, 332, 342, 352, 362 are made of electrically conductive material, e.g. copper, gold or another suitable metal or alloy and may be formed using the single and/or dual damascene operations.

In some embodiments, the metal lines 311, 321, 331, 341, 351 and 361 in each can be labeled as M0 through M6 and the metal vias 312, 322, 332, 342, 352, 362 can be labeled as V0 through V5. Further, the metal islands M1 through M6 and the metal vias V0 through V5 can be disposed in the plurality of IMD layers. As mentioned above, the IMD layers provide electrical insulating as well as structural support for the various features during many fabrication operations.

Figure 6:
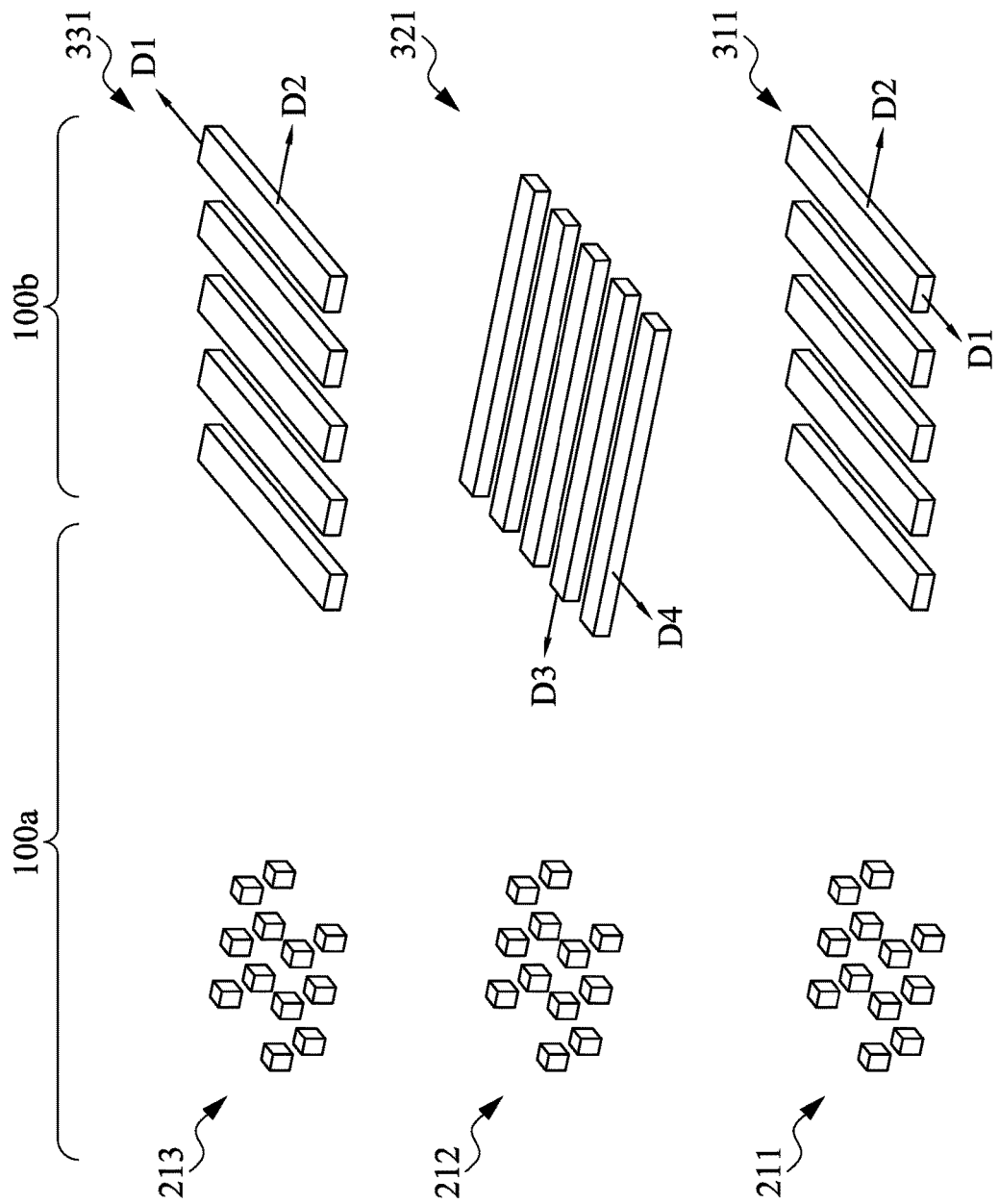
FIG. 6 illustrates a diagrammatic perspective view of metal islands in a memory region and metal lines in the logic region, in accordance with some embodiments of the present disclosure.

As shown in FIG. 6, in some embodiments, the metal lines 311 of the metal set 31 are extended along a first direction D1 and are arranged in parallel along a second direction D2. Similarly, the metal lines 331 of the metal set 33 are extended along the first direction D1 and are arranged in parallel along the second direction D2. Different from the metal sets 31 and 33, the metal lines 321 of the metal set 32 are extended along a third direction D3 and are arranged in parallel along a fourth direction D4. In some embodiments, D3 is different from D1, and D4 is different from D2. In some embodiments, the angle between the first direction D1 and the third direction D3 is larger than 0° and smaller than 180°. In some embodiments, the angle between the first and third directions D1 and D3 is from about 30° to about 150°. In alternative embodiments, the angle between the first and third directions D1 and D3 is from about 60° to about 120'. In another embodiment, the first direction D1 is substantially perpendicular to the third direction D3, but the disclosure is not limited thereto.

It should be noted that the metal islands 211 and the metal lines 311 may be formed in the same IMD layer, the metal islands 221 and the metal lines 321 may be formed in the same IMD layer, and the metal islands 231 an the metal lines 331 may be formed in the same IMD layer. As shown in FIG. 6, a length of the metal islands 211 is less than a length of the metal lines 311 in the same IMD layer, a length of the metal islands 221 is less than a length of the metal lines 321 in the same IMD layer, and a length of the metal islands 231 is less than a length of the metal lines 331 in the same IMD layer. In some embodiments, a width of the metal islands 211 may be less than a width of the metal lines 311 in the same IMD layer, a width of the metal islands 221 may be less than a width of the metal lines 321 in the same IMD layer, and a width of the metal islands 231 may be less than a width of the metal lines 331 in the same IMD layer. In other words, while the metal lines 311, 321, 331 have the extending directionality as mentioned above, are extended and arranged along different directions, the metal islands 211, 221 231 are free of the extending directionality. Additionally, a thickness of the metal islands and a thickness of the metal lines in the same IMD layer are the same.

The number of the interconnect structures 21, 22, 23, 24 and 25 in the memory region 100a and the number of the metal sets 31, 32, 33, 34, 35, 36 in the logic region 100b are only for illustrative purposes, not for limitation. There could be other number of layers and metal sets that is more or less than those shown in FIG. 1.

Figure 7:
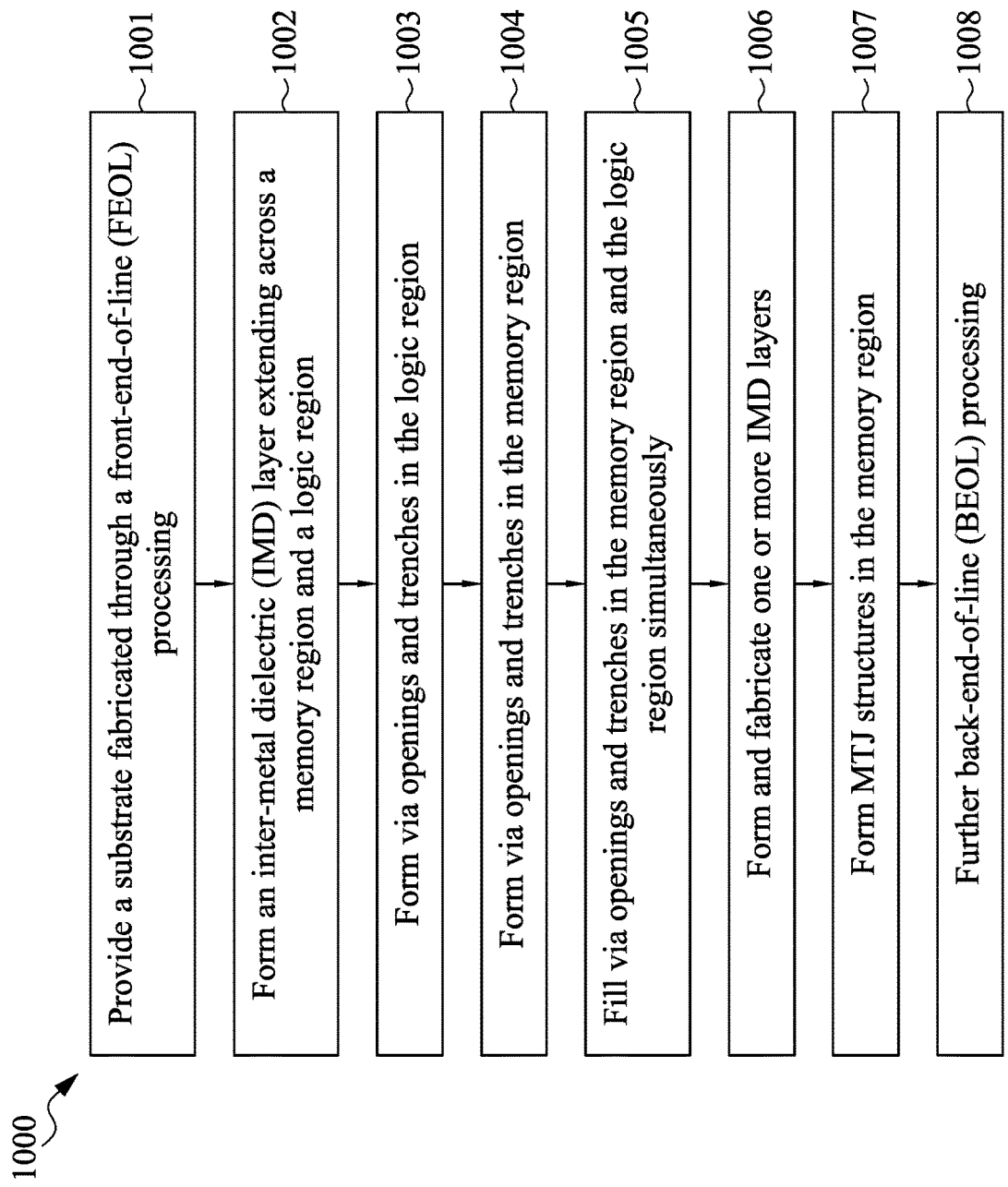
FIG. 7 is a flow chart of a method for manufacturing a semiconductor structure, in accordance with some embodiments of the present disclosure.
Figure 8:
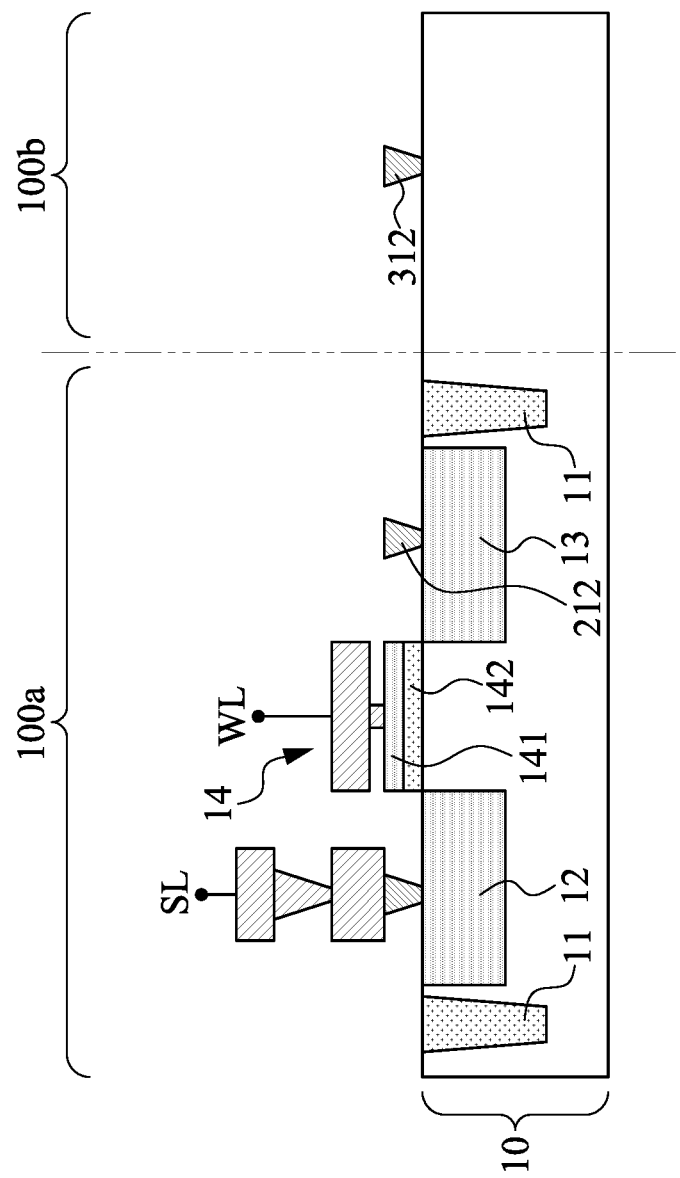
FIGS. 8-18 illustrate diagrammatic cross-sectional side views of one embodiment of a semiconductor structure at various stages of fabrication, according to the method of FIG. 7.

FIG. 7 is a flow chart of a method 1000 for manufacturing a semiconductor structure according to various aspects of the present disclosure. In the present embodiment, the method 1000 is for manufacturing a semiconductor structure that includes a fin structure. The method 1000 includes a number of operations (1001, 1002, 1003, 1004, 1005, 1006 1007 and 1008). FIGS. 8 to 21 illustrate diagrammatic cross-sectional side views of some embodiments of a semiconductor structure at various stages of fabrication, according to the method 1000 of FIG. 7. The method 1000 for manufacturing the semiconductor structure will be further described according to one or more embodiments. It is understood that the operations of the method for manufacturing the semiconductor structure may be rearranged or otherwise modified within the scope of the various aspects. It should be noted that additional processes may be provided before, during, and after the method, and that some other processes may only be briefly described herein. The order of the operations/processes may be interchangeable. Material, configuration, dimensions and/or processes the same as or similar to the foregoing embodiments described with respect to FIGS. 1 to 6 may be employed in the following embodiments, and detailed explanation thereof may be omitted. Thus, other implementations are possible within the scope of the various aspects described herein.

The method 1000 begins at operation 1001 where a substrate 10 is provided or received. As shown in the cross-sectional view of FIG. 8, the substrate 10 is fabricated through a front-end-of-line (FEOL) processing including CMOS or MOS technology processing to form various features known in the art. The substrate 10 has predetermined memory region 100a and logic region 100b. In some embodiments, a transistor structure is formed in the substrate 10 including a source region 12, a drain region 13, and a gate region 14 including a gate electrode 141 and a gate dielectric 142, in which the source region 12 connects to a source line (SL) and the gate electrode 233 connects to a word line (WL). An inter-layer dielectric (ILD) with the first via 212 in the memory region 100a and the metal via 312 in the logic region 100b is formed on the substrate.

At operation 1002, an inter-metal dielectric (IMD) layer (e.g., an oxide, a low-k dielectric, or an ultra low-k dielectric) is formed over the inter-layer dielectric (ILD) on the substrate 10 and extends across the memory region 100a and the logic region 100b. The IMD layer may be a silicon oxide containing layer formed of doped or undoped silicon oxide by a thermal CVD process or high-density plasma (HDP) process, e.g., undoped silicate glass (USG), phosphorous doped silicate glass (PSG) or borophosphosilicate glass (BPSG). Alternatively, the IMD layer may be formed of doped or P-doped spin-on-glass (SOG), PTEOS, or BPTEOS.

The IMD layer is fabricated in the memory region 100a and the logic region 100b through a damascene process (including but not limited to a dual damascene process) to form an interconnect layer 20 including a plurality of tower structures and a plurality of metal sets stacked on the substrate 10 in the memory region 100a and the logic region 100b, respectively.

At the operations 1003 and 1004, via openings and trenches are formed in the IMD layer in the logic region 100b, and via openings and trenches are formed in the IMD layer in the memory region 100a. When the IMD layer in the memory region is fabricated to form via openings and trenches, the logic region 100b is masked. And vice versa, when the IMD layer in the logic region 100b is fabricated to form via openings and trenches, the memory region 100a is masked. There is no limitation to the sequence for fabricating the memory region 100a and the logic region 100b. That is, the operations 1003 and 1004 are exchangeable. Either the memory region 100a or the logic region 100b may be fabricated first.

In operation 1002, a first inter-metal dielectric (IMD) layer 20a is formed over the substrate 10 and extends across the memory region 100a and the logic region 100b. In operation 1003, the first IMD layer 20a in the logic region 100b may be fabricated first by forming a trench while the memory region 100a is masked. In operation 1004, the first IMD layer 20a in the memory region 100a may be fabricated first by forming a trench while the logic region 100b is masked. In operation 1005, the trenches in the memory region 100a and the logic region 100b are filled with a conductive material to form the first metal island 211 on the first metal via 212 in the memory region 100a and to form the first metal line 311 on the first metal via 312 in the logic region 100b.

Figure 9:
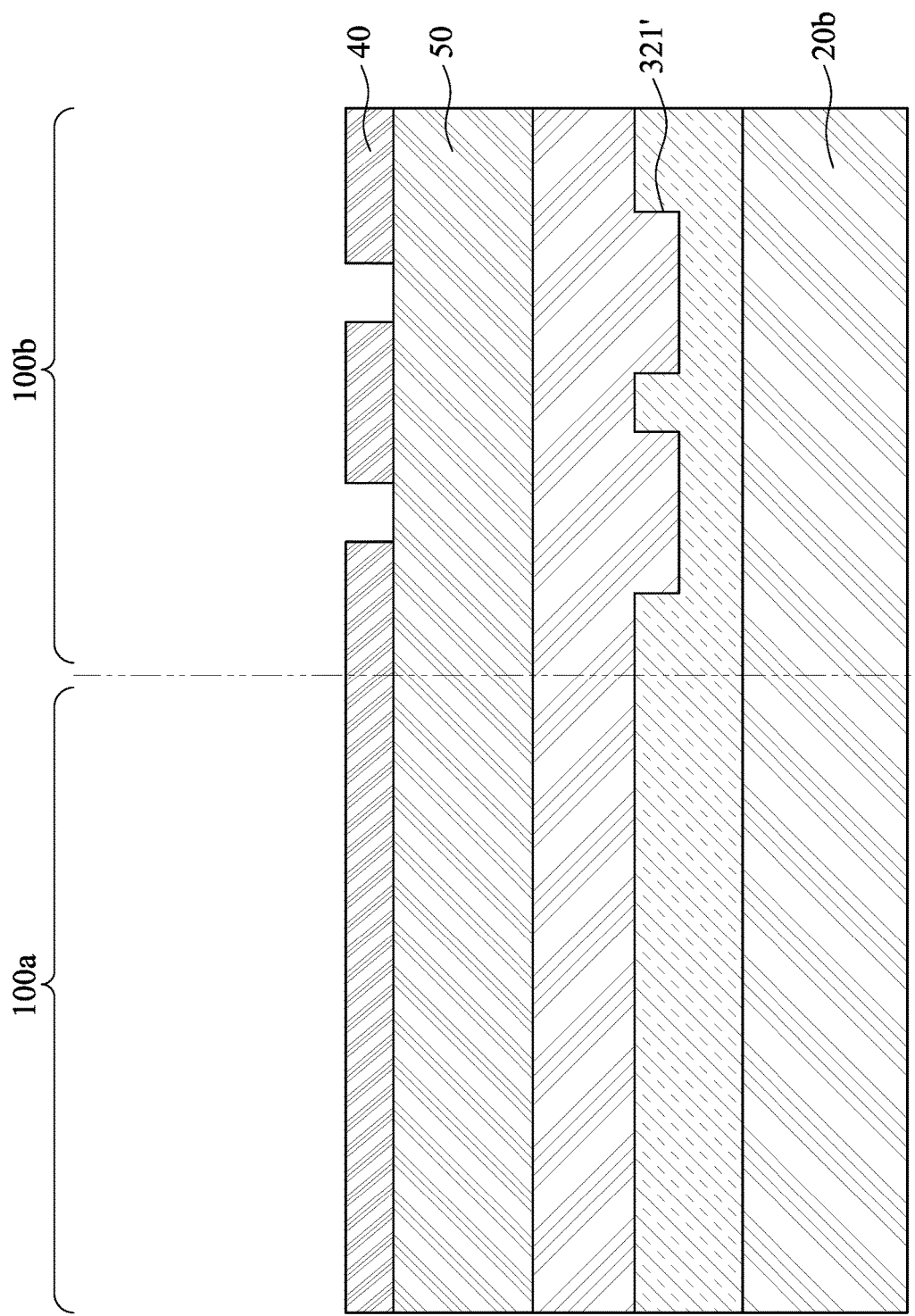
Figure 10:
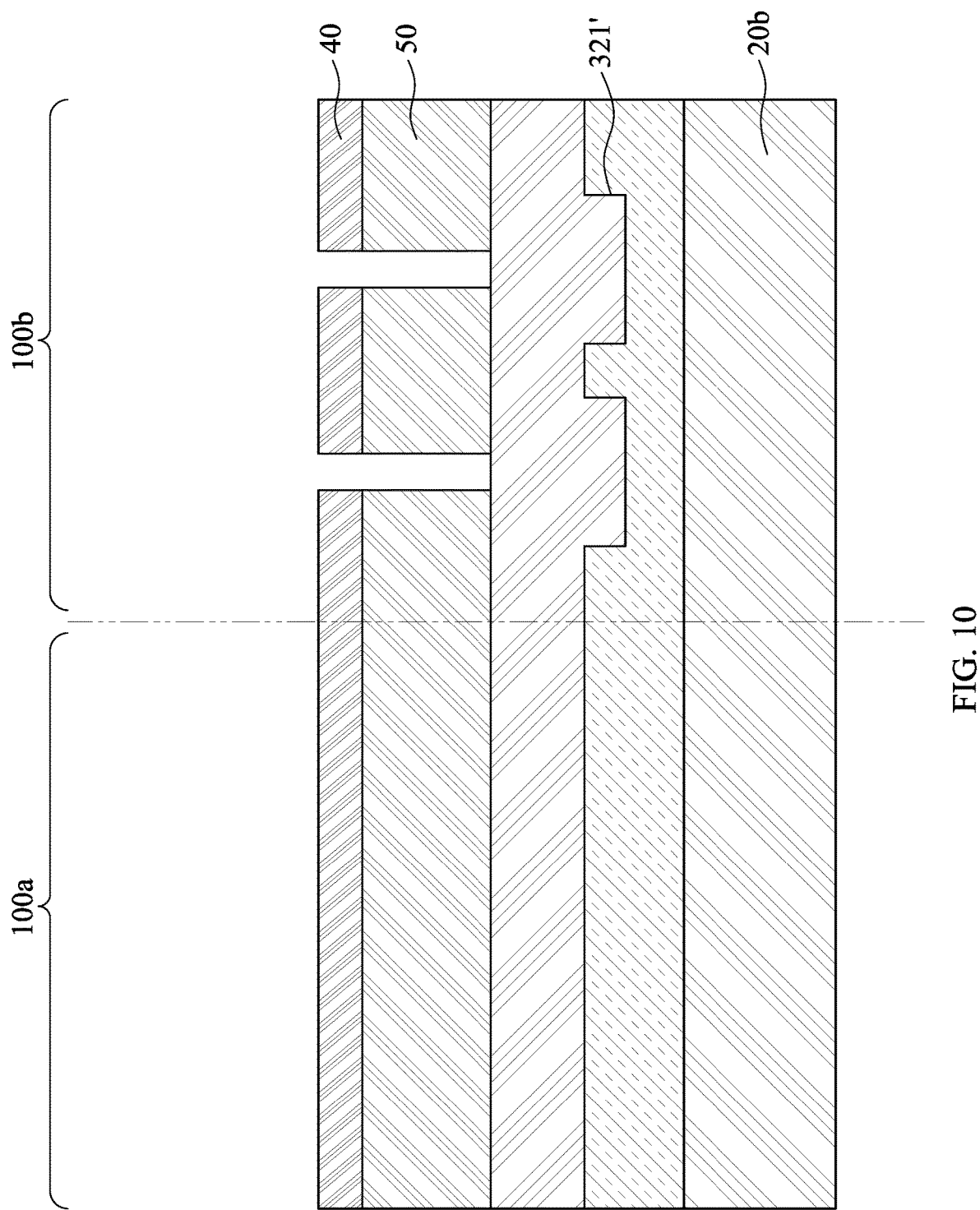
Figure 11:
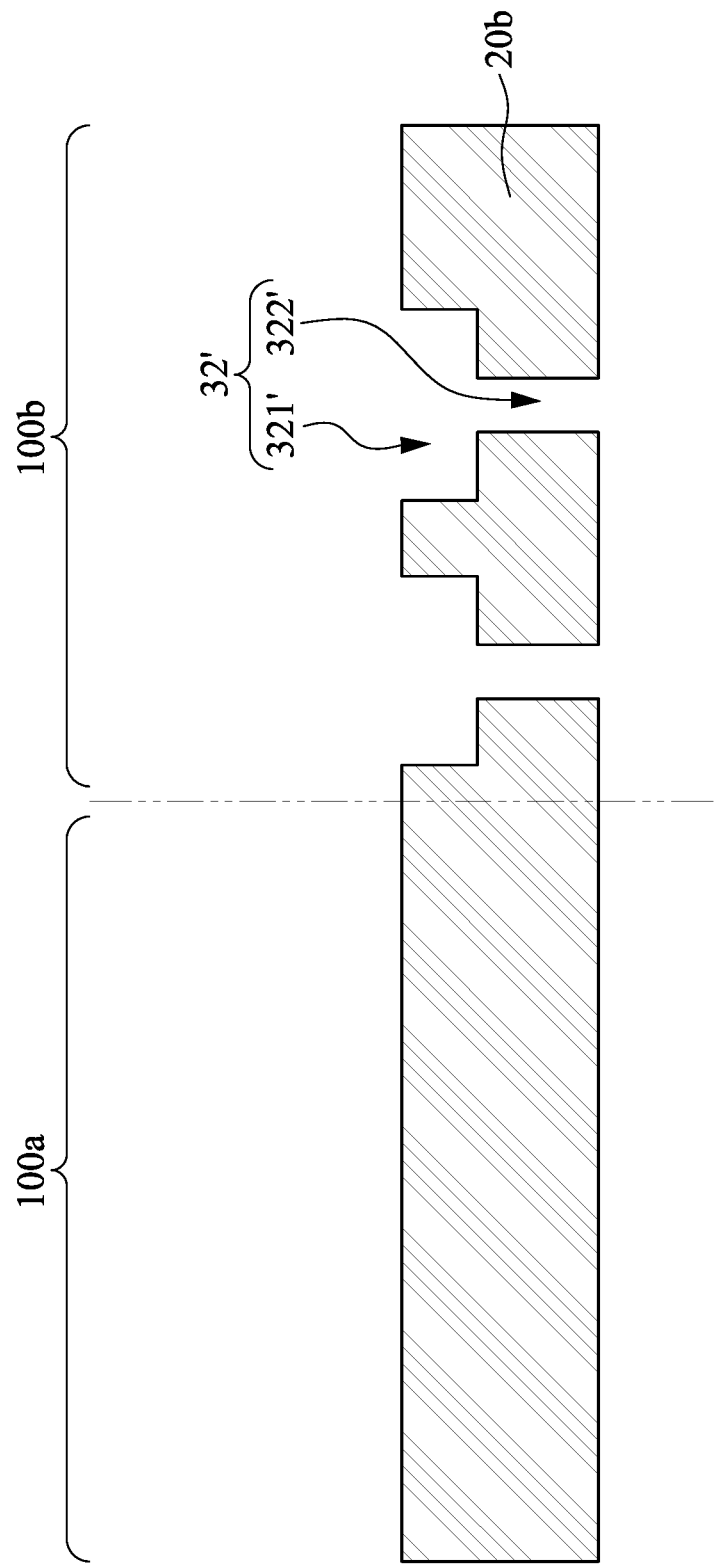

As shown in the cross-sectional view of FIGS. 9 to 11, a second IMD layer 20b is formed over the first IMD layer 20a to form via openings 322' and trenches 321' in the second IMD layer 20b while the memory region 100a is masked. In some embodiments, the via openings 322' and the trenches 321' are formed through the second IMD layer 20b in any sequence. In one embodiment, the via openings 322' may be formed after the trenches 321' are formed as shown in FIGS. 9 and 10. In an alternative embodiment, the trenches 321' may be formed after the via openings 322' are formed. The mask layer 50 can be a photoresist layer 40 or patterned hard mask having openings corresponding to the via opening 322' or the trench 321' to be formed. In some embodiments, the via opening 322' and the trench 321' may be formed through any etch process.

That photoresist layer 40 may be patterned using any photolithographic techniques, such as masking the layer of photoresist, exposing the mask layer 50 to light, then developing the unexposed portions. In some embodiments, a chromeless phase lithography (CPL) may advantageously be used to form the plurality of tower structures in the memory region 100a since the chromeless phase lithography has high optical contrast. That exposed portion is then etched using a nonselective plasma etch step, e.g., one that uses fluorocarbon chemistry. A preferred plasma that may be used to perform such an etching step may result from feeding a mixture of $C_4F_8$, oxygen and argon into a plasma etcher. That etcher is operated long enough to cause the plasma to etch through a mask layer 50. After the etch step, the photoresist layer 40 is removed such as by applying a photoresist ashing step, e.g. one that applies an oxygen or nitrogen containing plasma to remove the photoresist layer 40.

Figure 12:
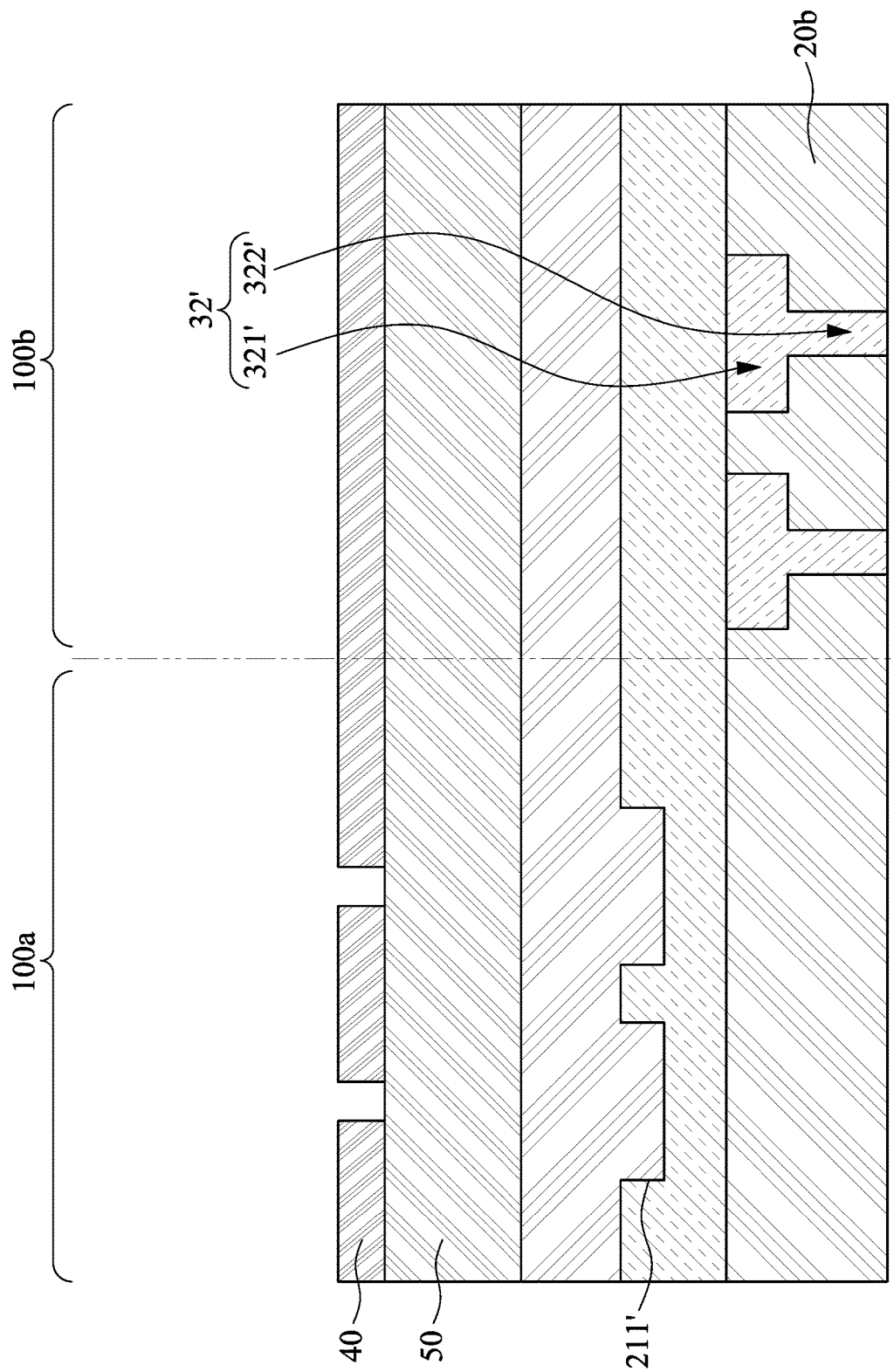
Figure 13:
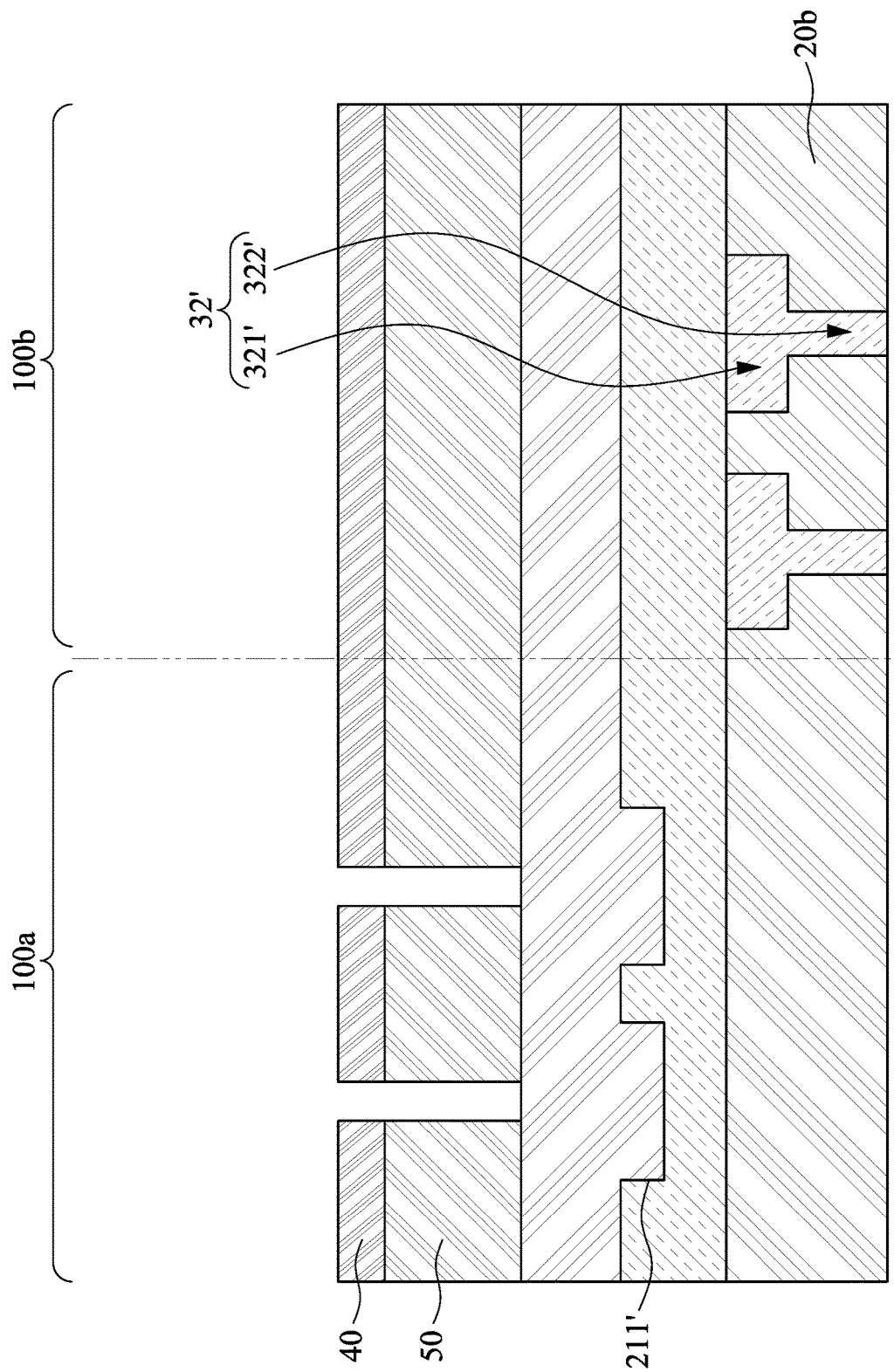
Figure 14:
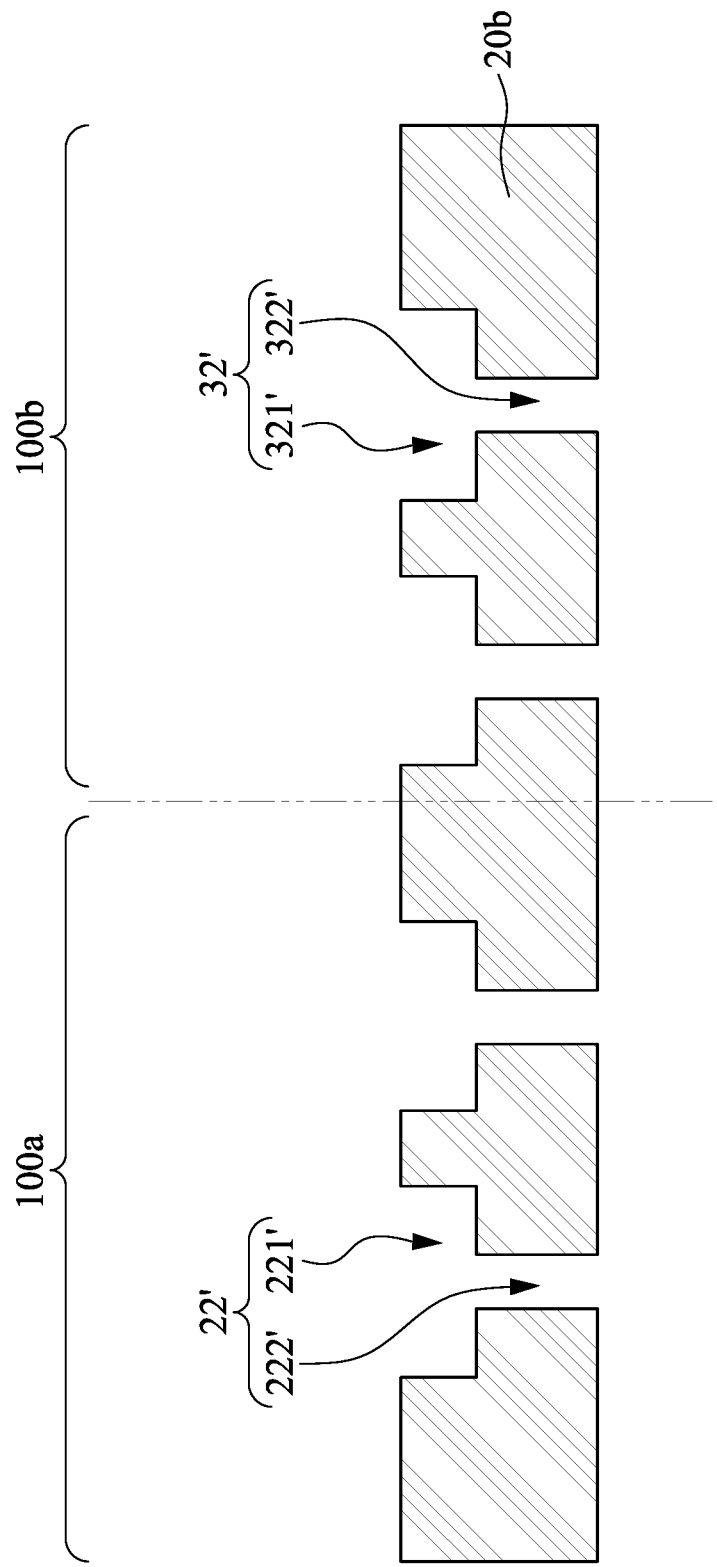

As shown in the cross-sectional view of FIGS. 12 to 14, when the second IMD layer 20b in the memory region 100a is fabricated, the logic region 100b is masked; and in some embodiment, via openings 222' and trenches 221' are formed in the memory region 100a in operation 1004. Various approaches for forming the via openings 222' and trenches 221' may be used. For example, in some embodiments, a dual damascene operation may be used to form dual relief cavities with a first set of one or more layers with a first pattern, and a second set of one or more layers with a second pattern. In some embodiments, an imagable layer may be employed, which is convertible to a hard mask upon exposure to a plasma etch that etches the second IMD layer 20b.

In some embodiments, the hard mask layer used for forming a dual damascene structure may be a single mask layer or a multi-layered mask layer. The mask layer is formed and patterned over the second IMD layer 20b. The hard mask layer can be formed by any suitable process to any suitable thickness, such as a chemical vapor deposition (CVD) process, physical vapor deposition (PVD), atomic layer deposition (ALD), high density plasma CVD (HDPCVD), other suitable methods, and/or combinations thereof. The CVD process, for example, may use chemicals including hexachlorodisilane (HCD or $Si_2Cl_6$), dichlorosilane (DCS or $SiH_2C_{12}$), bis(tertiarybutylamino) silane (BT-BAS or $C_8H_{22}N_2Si$) and disilane (DS or $Si_2H_6$). As shown in FIGS. 9, 10, 12 and 13, the hard mask layer 50 used in the logic region 100b and the memory region 100a is a multi-layered mask layer, which may include a low-temperature oxide layer, a silicon carbon nitride (SiOC) layer, a silicon oxynitride (SiO) layer or other material, such as silicon nitride, silicon carbide, other suitable material, or combinations thereof. In some embodiments, the mask layer 50 can further include a bottom layer, a middle layer, a sacrificial layer, and/or anti-reflective coating, but the disclosure is not limited to this. A photoresist layer 40 is formed over a hard mask layer 50 with patterns corresponding to the trenches 222', 322' or via 221', 222' to be formed using chromeless phase lithography (CPL).

In some embodiments, the dual damascene process is performed with forming a photoresist layer over a hard mask layer with any suitable thickness and forming trench or via opening pattern using chromeless phase lithography (CPL), which is used to achieve high resolution by using phase edge interference. By using CPL, the tower structures may be arranged in a staggered or offset manner as shown in FIG. 4 where the pitch between two adjacent tower structures is reduced. In some embodiments, the pitch is from about 20 nm to about 300 nm. In some embodiments, the pitch is from about 50 nm to about 250 nm. In some embodiments, the pitch is from about 75 nm to about 200 nm. Also by using CPL, the position and shape of the via openings and trenches to be formed can be precisely controlled. The shape of the resulting metal islands 241, 251 or the MTJ structure 26 may be adjusted as desired, including but not limited to circular, rectangular, square elliptical, oval or other shapes. Due to such CPL process, the tower structures can be arranged in a XY staggered pattern and several metal interconnect structures 21, 22, 23, 24, 25 and MTJ structure 26 mentioned below in each tower structure are stacked symmetrically. Thus, a high-density memory cell array is achieved so as to keep fast memory speeds, reliable read/write operations and/or to achieve better performance while semiconductor memory devices are reduced in size.

An etching process is performed to form the via opening 222' and a trench 221' through the second IMD layer 20b. In some embodiments, the via 222 or the trench 221 may be formed through a dry etch process such as a plasma etching.

Figure 15:
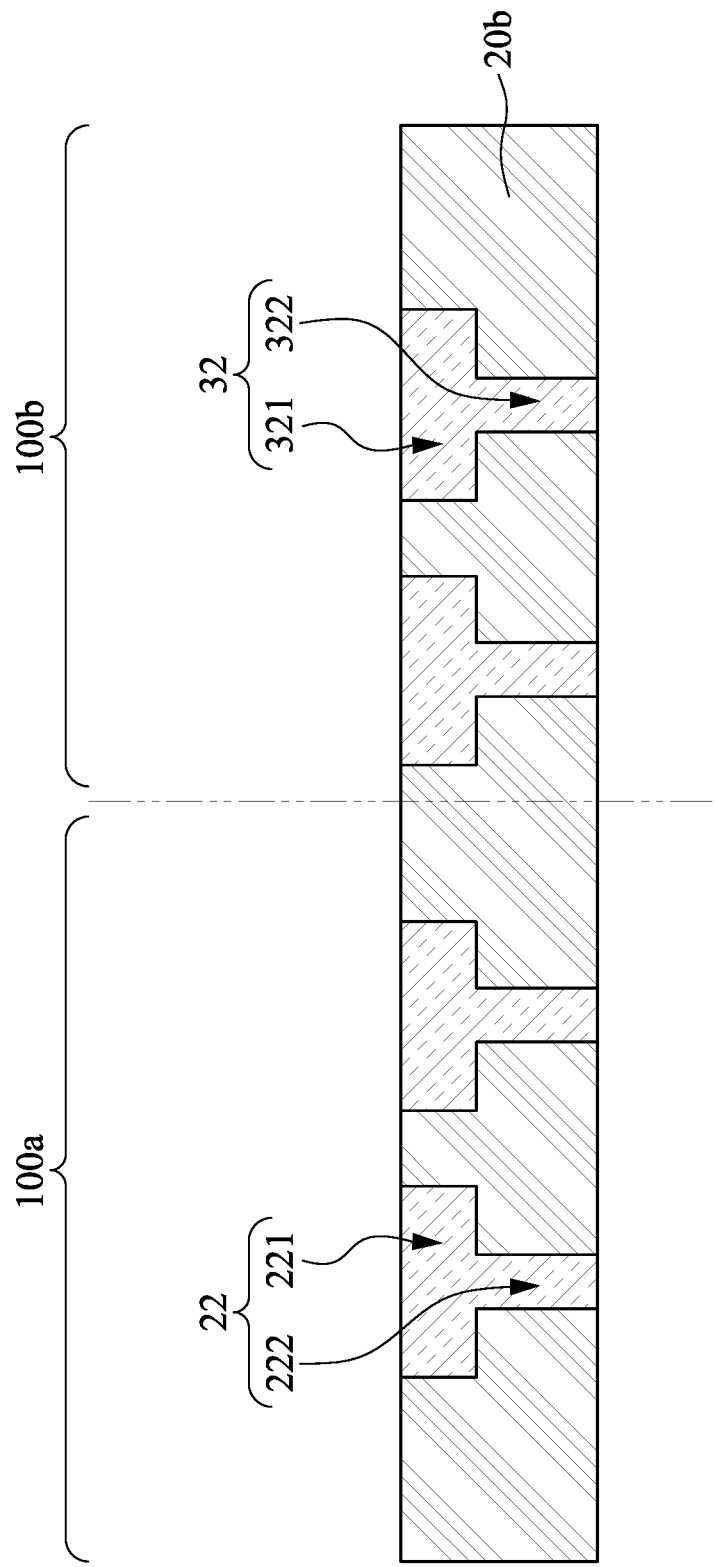
Figure 16:
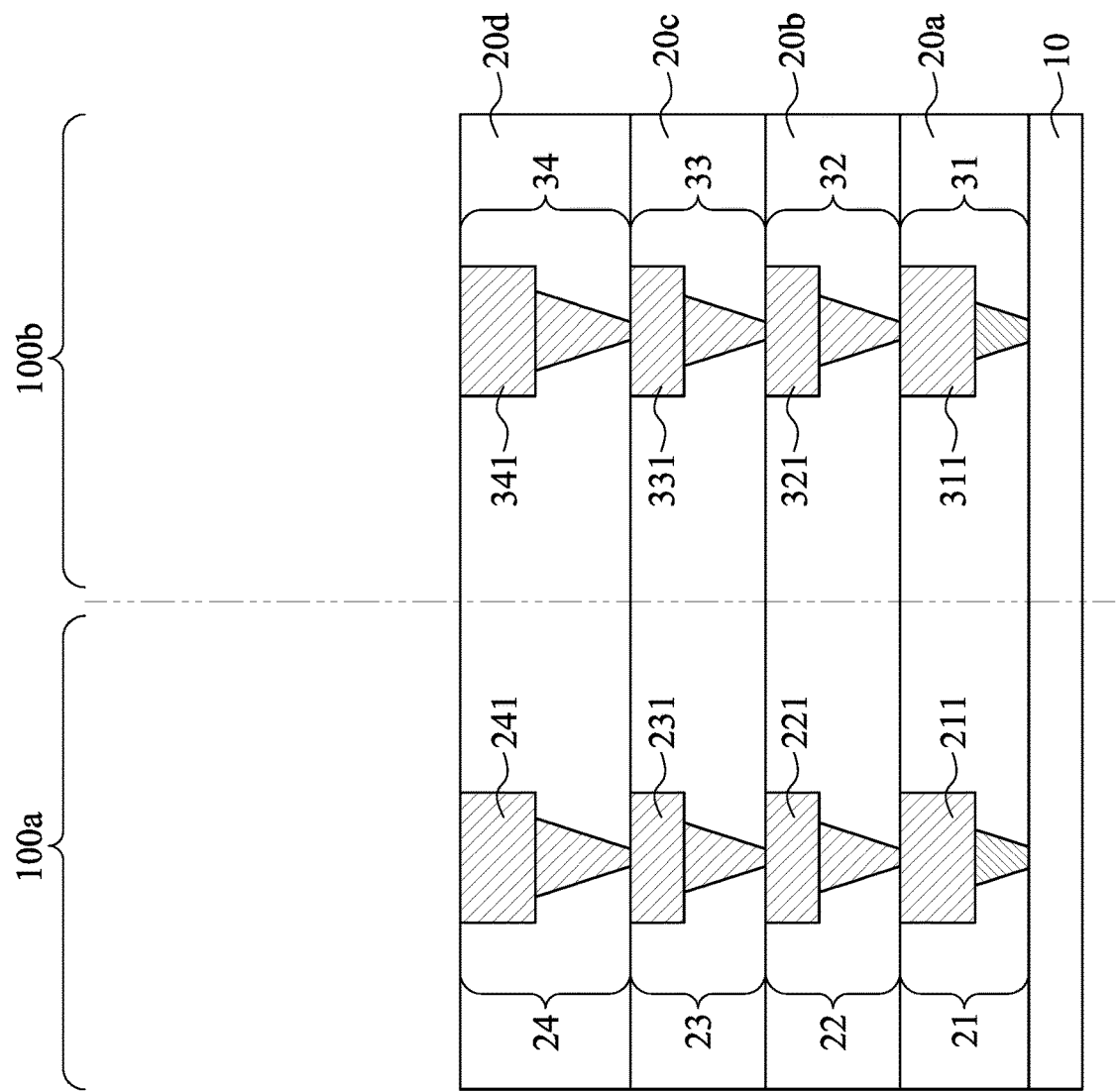
Figure 17:
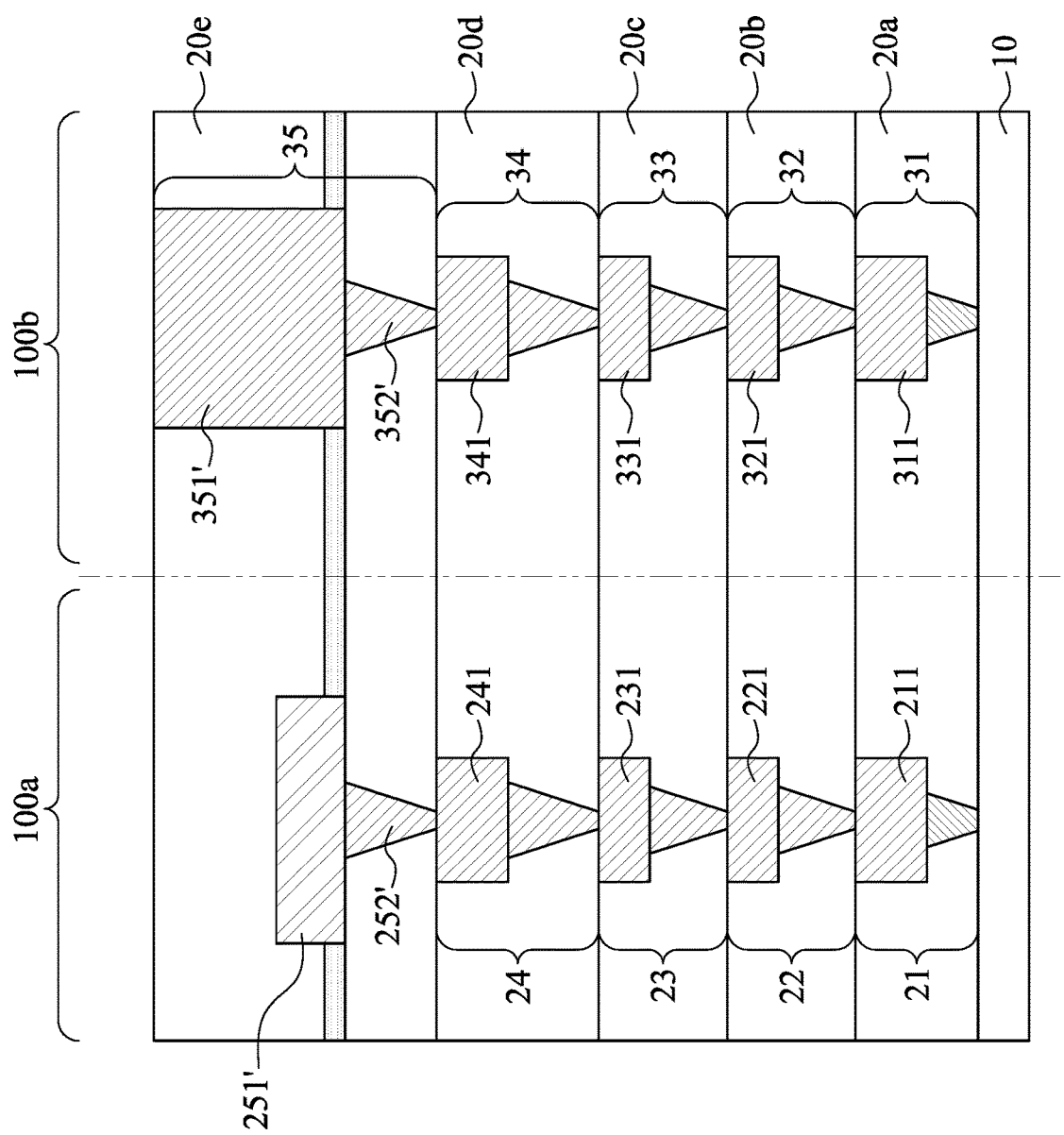

With further reference to FIG. 15, the method 1000 then proceeds to operation 1005 where the via opening and trenches are filled with a conductive material in the memory region 100a and the logic region 100b simultaneously followed by a planarization procedure to remove excess conductive material to form vias 222 and metal islands 221 in a metal interconnect structure 22 in the memory region 100a and also form metal vias 321 and metal lines 322 of a metal set in the logic region 100b. Such integrated procedure is provided to fabricate the IMD layer in the memory region 100a and the logic region 100b, which reduces process time and costs.

The conductive material is, for example, at least one material selected from the group consisting of aluminum (Al), aluminum alloy (Al-alloy), copper (Cu), gold (Au), silver (Ag), tungsten (W), and molybdenum (Mo). Further, the conductive material may be formed using a process selected from the group consisting of a reflow technique for a layer formed by sputtering the conductive material, a chemical vapor deposition (CVD) technique, an electroplating (ECP) technique and so forth. In the case where the electroplating technique is used, a seed layer is required so that current can flow during electrolyzing.

At operation 1006, the operations 1003 to 1005 are repeated to form and fabricate one or more IMD layers. It is appreciated from FIGS. 1 and 16 that after the fabrication of the first IMD layer 20a is complete to form the first metal interconnect structure 21 in the memory region 100a and the first metal set 31 in the logic region 100b, a second IMD layer 20b is formed over the first IMD layer 20a and then is fabricated to form the second metal interconnect structure 22 in the memory region 100a and the second metal set 32 in the logic region 100b. In the same way, a third and fourth metal interconnect structures 23, 24 in the memory region 100a and the third and fourth metal sets 33, 34 in the logic region 100b are formed subsequently in a third and fourth IMD layers 20c, 20d. The metal islands 211, 221, 231, 241 are stacked symmetrically along the z axis. In some embodiments, the metal islands 211, 221, 231, 241 and the metal vias 212, 222, 232, 242 are stacked symmetrically along the z axis. It is noted that the fabrication of the memory region 100a and that of the memory region 100b take turns in one IMD layer and the sequence in different IMD layers may be different. For example, in the first IMD layer 20a, the fabrication of the logic region 100b is performed before that of the memory region 100a and in the second IMD layer 20b, the fabrication of the logic region 100b may be performed after that of the memory region 100a.

Figure 18:
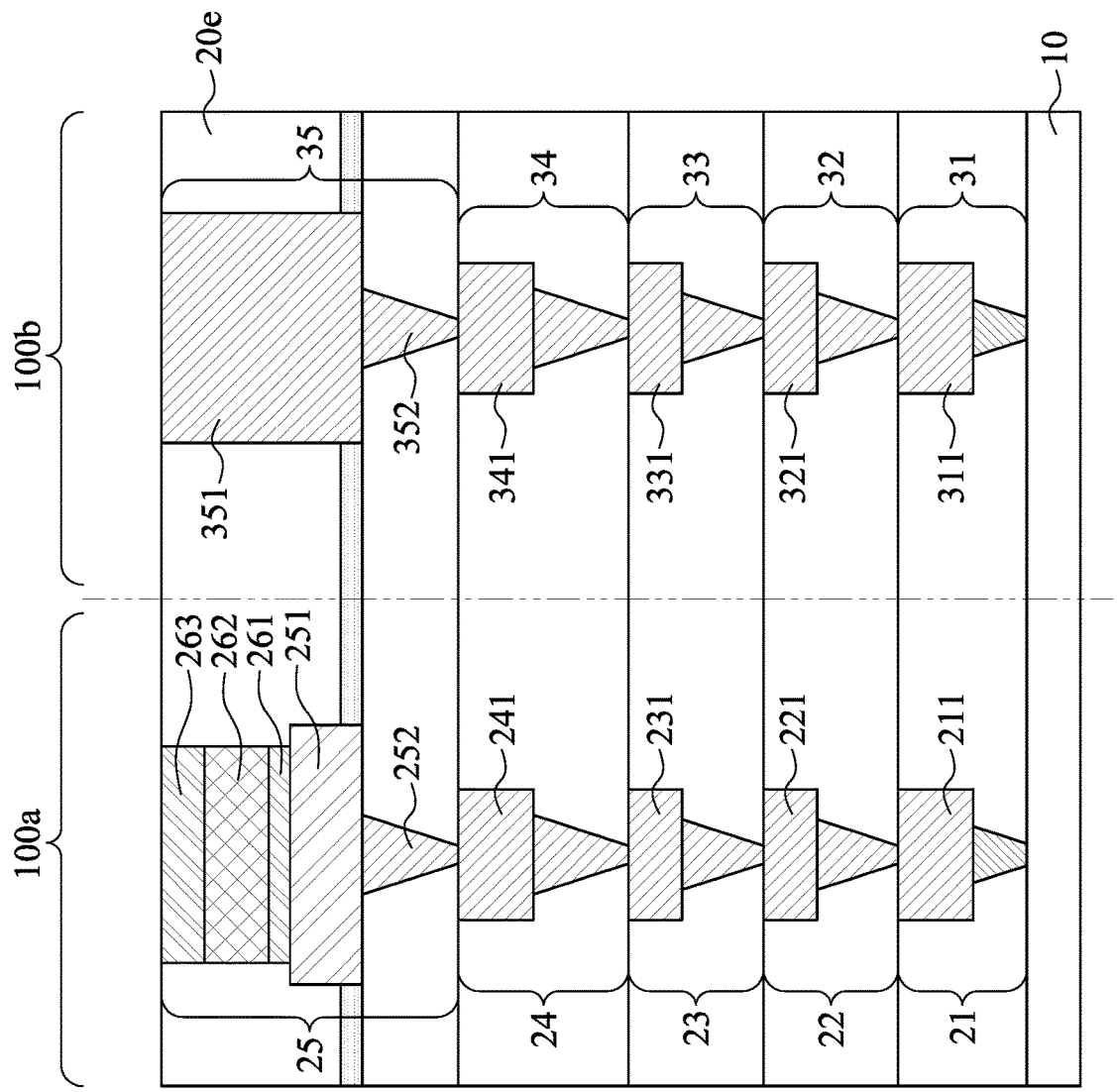
Figure 21:
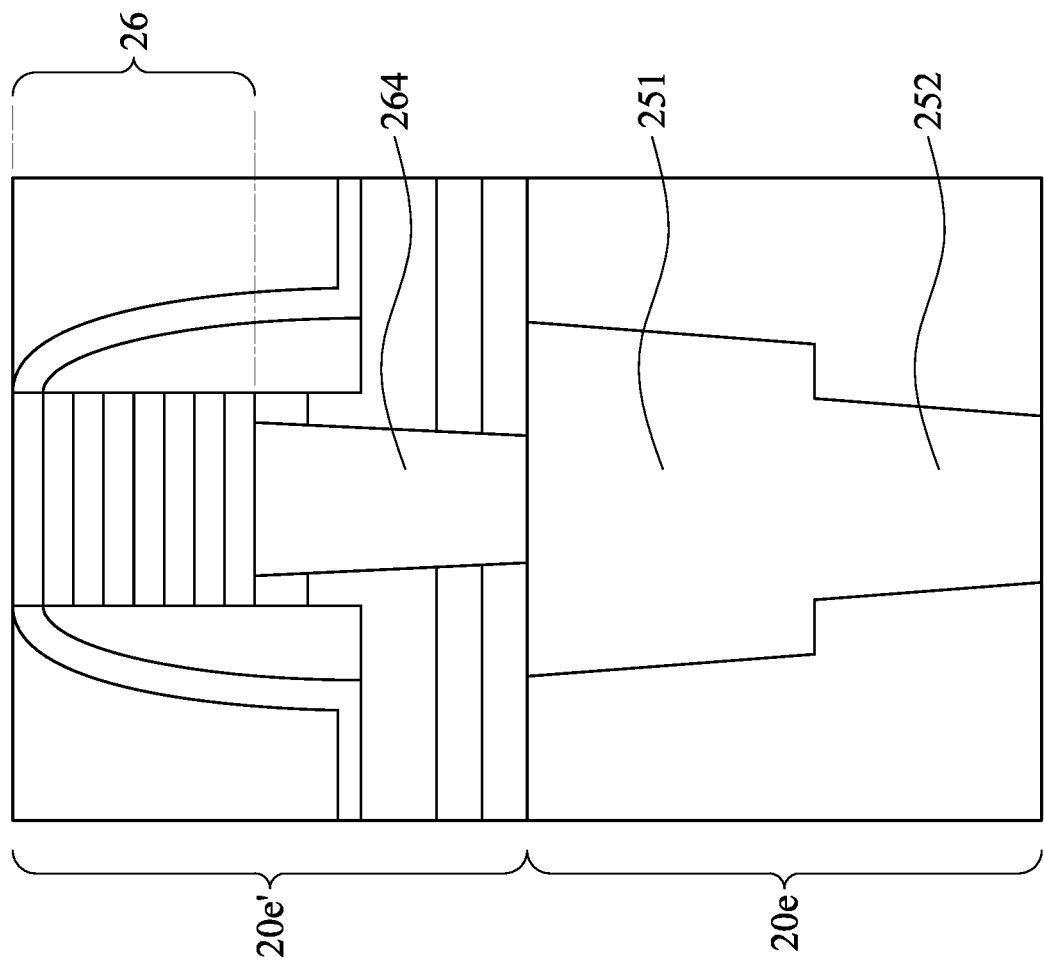

At operation 1006, a plurality of MTJ structures 26 are formed over the fifth metal islands 251 in the fifth IMD layer 20e. After a fifth IMD layer 20e is formed over the fourth IMD layer 20d, via openings 252', 352' and trenches 251', 352' are formed in the memory region 100a and the logic region 100b in turns and then are filled with a conductive material to form a fifth metal via 252 and a fifth metal island 251 in the memory region 100a and a fifth metal set 35 in the logic region 100b. In some embodiments as shown in FIGS. 1 and 18, the MTJ structure 26 may be formed on the fifth metal island 251 without an electrode via (BEVA). In alternative embodiments as shown in FIGS. 2, 3 and 21, the MTJ structure 26 may be formed on the fifth metal island 251 with BEVA 264.

In the embodiments shown in FIGS. 1 and 18, a bottom electrode 261 is deposited over the fifth metal island 251. The bottom electrode 261 may comprise TiN, TaN, Ta, Ti, W, Cu, Mg, Ru, Cr, Co, Fe, Ni, or alloys. The bottom electrode 261 may be deposited by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Then, an MTJ stack 262 is deposited in a form of multiple material stacks (not shown) over the bottom electrode 261. In some embodiments, the MTJ stack 262 has a thickness in a range from about 150 Å to about 250 Å. In some embodiments, the top surface of the MTJ stack 262 has a roughness from about 2 Å to about 10 Å. The MTJ stack 262 may be formed by a variety of techniques, e.g., IMP deposition, high-density ICP deposition, sputtering, PVD, CVD, LPCVD, PECVD, and the like. In some embodiments, the MTJ stack 262 may include ferromagnetic layers, spacers, and a capping layer. The capping layer is formed on the ferromagnetic layer. Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacer may include non-ferromagnetic metal, for example, Ag, Au, Cu, Ta, W, Mn, Pt, Pd, V, Cr, Nb, Mo, Tc, Ru or the like. Another spacer may also include insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer whose magnetic polarity or magnetic orientation can be changed during write operation of its associated MRAM cell. The ferromagnetic layers and the spacer may function as a fixed or pinned layer whose magnetic orientation may not be changed during operation of its associated MRAM cell. It is contemplated that the MTJ stack 262 may include an antiferromagnetic layer in accordance with other embodiments.

A top electrode 263 is deposited over the MTJ stack 262. The top electrode 263 may be formed by a variety of techniques, e.g., IMP deposition, high-density ICP deposition, sputtering, PVD, CVD, LPCVD, PECVD, and the like. In some embodiments, the top electrode 263 comprises TiN, TaN, Ta, Ti, W, Cu, Mg, Ru, Cr, Co, Fe, Ni, or alloys.

Figure 19:
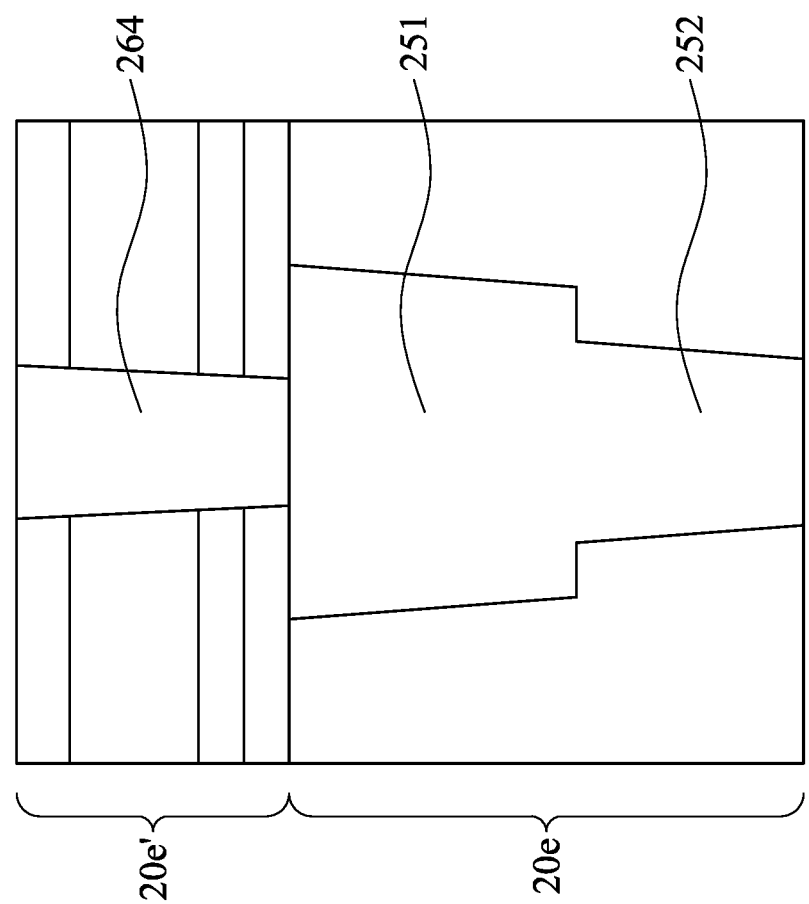
FIGS. 19-21 illustrate diagrammatic cross-sectional side views of another embodiment of a semiconductor structure at various stages of fabrication, according to the method of FIG. 7.

In another embodiments shown in FIGS. 2, 3 and 19, various dielectric layers of dielectric stack 20e' may be formed on the fifth metal island 251 by any suitable deposition technique, e.g., CVD, PECVD, ALD, PEALD, PVD, spin-on and/or the like, or a combination thereof. A bottom electrode via (BEVA) 264 is formed in the dielectric stack 20e' and electrically connected to the fifth metal island 251. In some embodiments, the materials and processing techniques used to form the BEVA 264 may be the same as those used to form vias in the interconnect layers described above. In other embodiments, the conductive materials and processes used to form BEVA 264 may be different from the conductive materials and processes used to form the conductive features of the metal interconnect structures formed in prior, or subsequent, processing steps. For example, Cu may be used as the conductive fill material in the metal interconnect structures 21, 22, 23, 24, 25, while TiN may be used as the conductive fill material in BEVA 264. In another embodiment, another conductive material such as Co may be used as the conductive fill material in BEVA 264.

Figure 20:
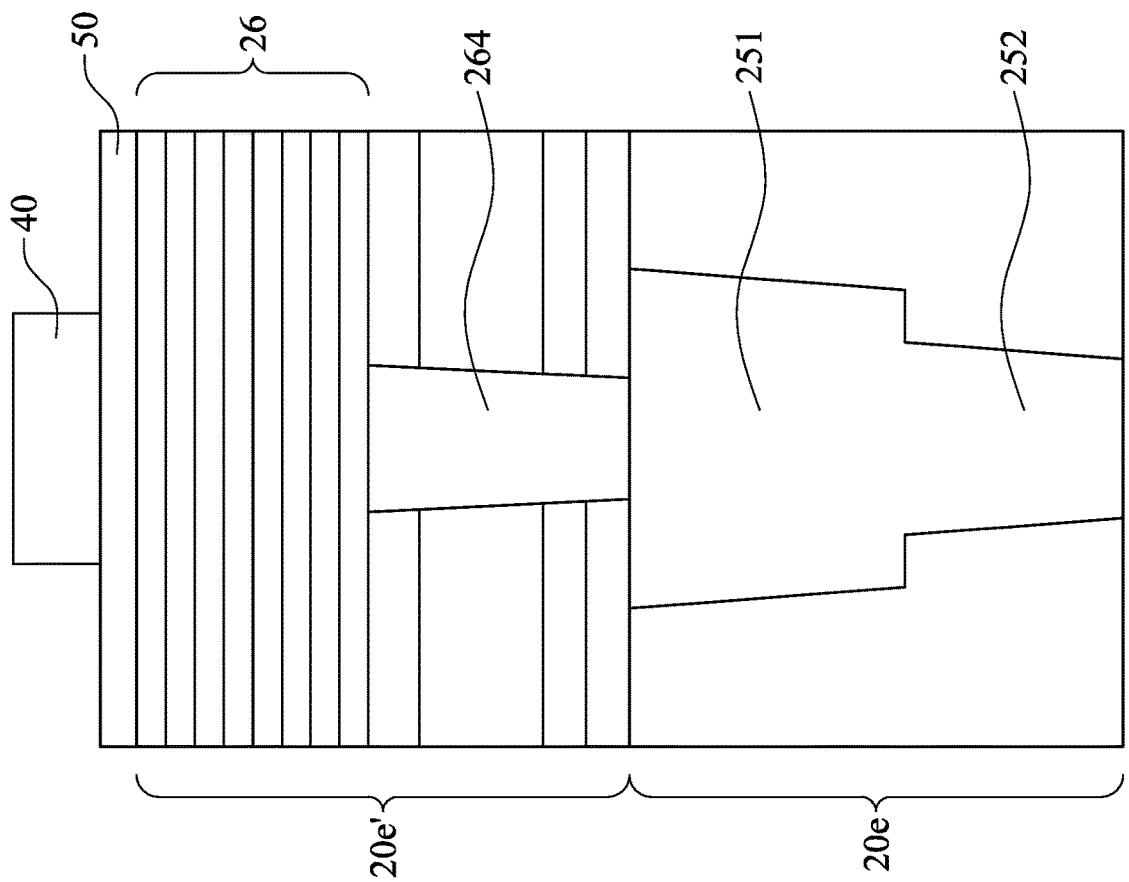

FIG. 20 illustrates the formation of the MTJ structure 26 including deposition of various materials over the BEVA 264 to form the bottom electrode 261, MTJ stack 262 and top electrode 263. A hard mask layer 50 is deposited on top of the top electrode 263, and a photoresist layer 40 is coated and patterned over the hard mask layer 50 using acceptable photolithography techniques (including, but not limited to the chromeless phase lithography) for the ensuing the formation of tower structures (MRAM array). The hard mask layer 50 may have a multi-layer structure, which may include, for example, an oxide layer, an advanced patterning film (APF) layer and an oxide layer. Each of the oxide layer, the APF layer, and the oxide layer may be formed by a variety of techniques. e.g., IMP deposition, high-density ICP deposition, sputtering, PVD, CVD, LPCVD, PECVD, and the like. In some embodiments, the mask layer is configured to pattern the bottom electrode 261, the MTJ stack 262 and the top electrode 263. In some embodiments, the MTJ stack 262 and the top electrode 263 are formed by any etch techniques. In an embodiment, the etching process may a dry etch such as, plasma etch processing. Exemplary processes include, but are not limited to, inductively coupled plasma (ICP), transformer coupled plasma (TCP), electron cyclotron resonance (ECR), reactive ion etch (RIE), and/or other suitable processes. For example, a suitable anisotropic etch, such as RIE, may be used to pattern the hard mask layer 50 using the patterned photoresist layer 40 as an etch mask, and that pattern may be transferred to form the top electrode 263, the MTJ stack 262, and the bottom electrode 261 as illustrated in FIG. 21 using the patterned hard mask layer 50 as an etch mask. The MTJ structure 26 is etched with RIE to have a trapezoidal, rectangular or other shapes viewing from a cross-sectional side view. Any remaining photoresist material may be removed by performing a surface clean process (e.g., an ashing process using oxygen or nitrogen containing plasma).

Operation 1007 is further back-end-of-line (BEOL) processing to complete formation of the semiconductor structure including forming an upper metal line 28 as a bit line (BL) connecting to the MTJ structure 26 through an upper metal via 282 in the memory region 100a and also forming an sixth metal set 36 connecting to the fifth metal set 35 in the logic region 100b.

Figure 22:
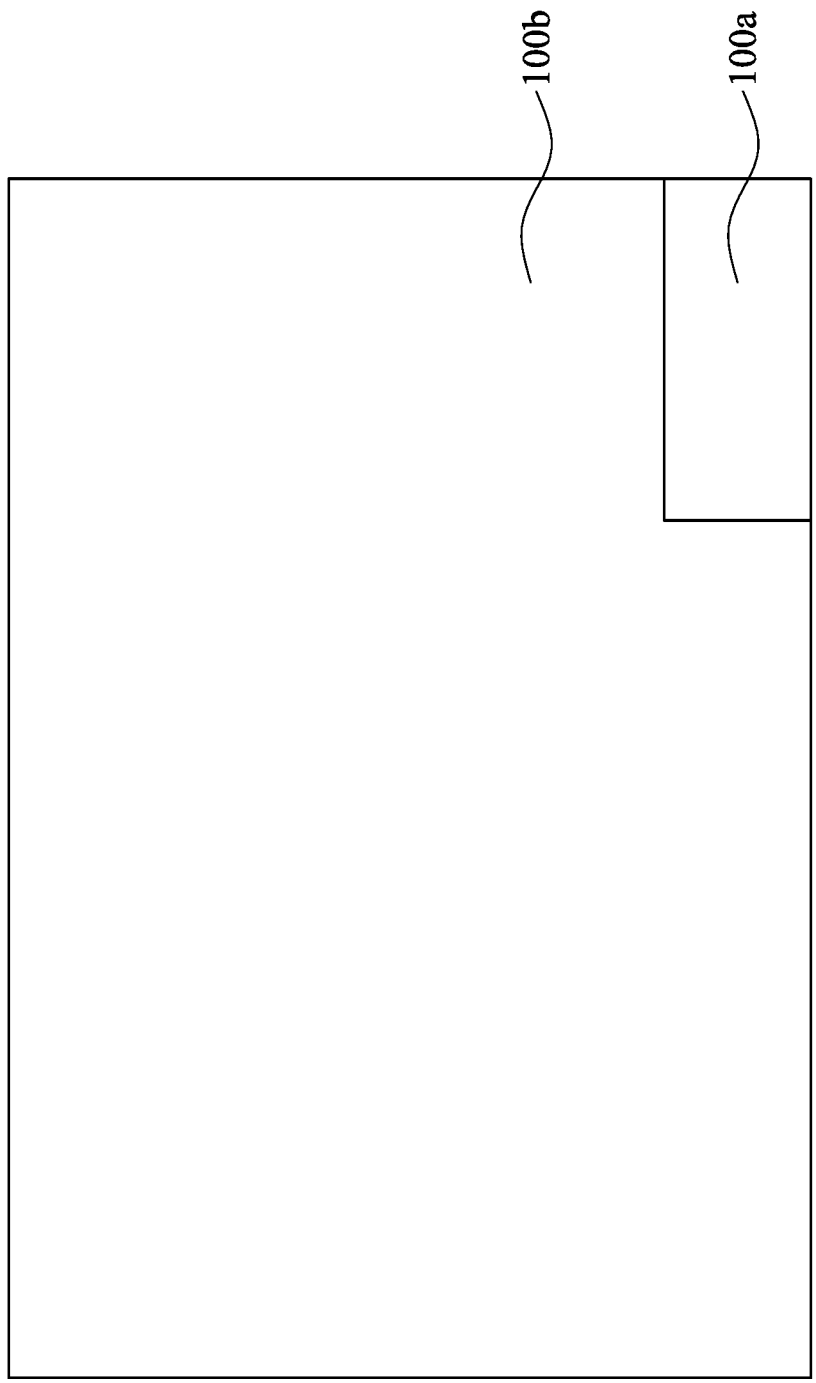
FIG. 22 is a top view of a semiconductor structure having a memory region and a logic region, in accordance with some embodiments of the present disclosure.

FIG. 22 illustrates a semiconductor structure with a memory region 100a locate at a corner o while the logic region 100b locate at the remaining area. The method in the present invention is provided to form a high-density MRAM array, which may be incorporated into a logic circuit through an integrated process to achieve improved performance with reduced process time.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the figures. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In some embodiments, a semiconductor structure comprises a substrate including a memory region and a logic region, and an interconnect layer disposed over the substrate and extending across the memory region and the logic region. The interconnect layer includes a plurality of tower structures disposed in the interconnect layer within the memory region and each tower structure comprising at least one metal interconnect structure and a magnetic tunnel junction (MTJ) structure stacked over the metal interconnect structure, and a plurality of metal sets stacked over the substrate within the logic region; wherein the plurality of tower structures are arranged over the substrate in a XY staggered pattern; and wherein the at least one metal interconnect structure and the magnetic tunnel junction (MTJ) structure in each tower structure are substantially symmetric along a stacking direction.

In some embodiments, a semiconductor structure comprises a substrate and a plurality of tower structures disposed over the substrate. Each tower structure includes a plurality of metal interconnect structures and a magnetic tunnel junction (MTJ) structure stacked over the metal interconnect structures. The plurality of tower structures are separated from each other and arranged on the substrate in a XY staggered pattern. At least one metal interconnect structure and the magnetic tunnel junction (MTJ) structure in each tower structure are substantially symmetric along a stacking direction.

In some embodiments, a method of manufacturing a semiconductor structure comprises providing a substrate; forming an inter-metal dielectric (IMD) layer on the substrate extending across a memory region and a logic region; forming via openings and trenches in the IMD layer in the memory region; forming via openings and trenches in the IMD layer in the logic region; filling the via openings and trenches in the memory region and the logic region simultaneously to form a plurality of tower structures with at least one metal interconnect structure in each tower structure in the memory region and to form at least one metal set in the logic region; and forming an MTJ structure in the tower structure to connect the metal interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A semiconductor structure, comprising:
    a substrate comprising a memory region and a logic region-; and
    an interconnect layer disposed over the substrate and extending across the memory region and the logic region and comprising:
        a plurality of tower structures disposed in the interconnect layer within the memory region and each tower structure comprising at least one metal interconnect structure and a magnetic tunnel junction (MTJ) structure stacked over the metal interconnect structure, and
        a plurality of metal sets stacked over the substrate within the logic region,
    wherein the plurality of tower structures are arranged on the substrate in a XY staggered pattern, and
    wherein the at least one metal interconnect structure and the magnetic tunnel junction (MTJ) structure in each tower structure are substantially symmetric along a stacking direction,
    wherein each metal set comprises a group of metal lines arranged in parallel and a group of metal vias coupled to the metal lines; and
    wherein the metal lines in one metal set are arranged in parallel and extended along a first direction and those in an adjacent metal set are arranged in parallel and extended along a second direction, wherein the angle between the first direction and the second direction is larger than 0° and smaller than 180°.

2. The semiconductor structure of claim 1, wherein the pitch between two adjacent tower structures is from about 20 nm to about 300 nm.

3. The semiconductor structure of claim 1, wherein each metal interconnect structure comprises a metal island and a metal via coupled to each other; and the shape of the metal island is rectangular, square, elliptical, circular or oval from a cross-sectional top view.

4. The semiconductor structure of claim 1, wherein each metal interconnect structure comprises a metal island, and a length of the metal island is less than a length of the metal line.

5. The semiconductor structure of claim 1, wherein the MTJ structure includes a bottom electrode coupled to the metal interconnect structure directly, an MTJ stack formed on the bottom electrode and a top electrode formed on the MTJ stack.

6. The semiconductor structure of claim 5, wherein the MTJ stack includes a bottom ferromagnetic layer formed on the bottom electrode, a tunnel barrier layer disposed over the bottom ferromagnetic layer, and a top ferromagnetic layer disposed over the tunnel barrier layer, so that the top electrode is formed on the top ferromagnetic layer.

7. The semiconductor structure of claim 1, wherein the MTJ structure includes
    a bottom electrode coupled to the metal interconnect structure through a bottom electrode via (BEVA),
    an MTJ stack formed on the bottom electrode, and
    a top electrode formed on the MTJ stack.

8. The semiconductor structure of claim 7, wherein the MTJ stack includes a bottom ferromagnetic layer formed on the bottom electrode, a tunnel barrier layer disposed over the bottom ferromagnetic layer, and a top ferromagnetic layer disposed over the tunnel barrier layer, so that the top electrode is formed on the top ferromagnetic layer.

9. A semiconductor structure, comprising:
    a substrate comprising a memory region and a logic region;
    a plurality of tower structures disposed over the substrate within the memory region, and each tower structure comprising a plurality of metal interconnect structures and a magnetic tunnel junction (MTJ) structure stacked over the metal interconnect structures; and a plurality of metal sets stacked over the substrate within the logic region;

wherein each metal set comprises a group of metal lines arranged in parallel and a group of metal vias coupled to the metal lines; and wherein the metal lines in one metal set are arranged in parallel and extended along a first direction and those in an adjacent metal set are arranged in parallel and extended along a second direction, wherein the angle between the first direction and the second direction is larger than 0° and smaller than 180°.

10. The semiconductor structure of claim 9, wherein the pitch between two adjacent tower structures is from about 20 nm to about 300 nm.

11. The semiconductor structure of claim 9, wherein each metal interconnect structure comprises a metal island and a metal via coupled to each other; and the shape of the metal island is rectangular, square, elliptical, circular or oval from a cross-sectional top view.

12. The semiconductor structure of claim 9, wherein the MTJ structure includes:
   a bottom electrode coupled to the metal interconnect structure directly,
   an MTJ stack formed on the bottom electrode, and
   a top electrode formed on the MTJ stack.

13. The semiconductor structure of claim 9, wherein the MTJ structure includes a bottom electrode coupled to the metal interconnect structure through a bottom electrode via (BEVA), an MTJ stack formed on the bottom electrode and a top electrode formed on the MTJ stack.

14. A method of manufacturing a semiconductor structure, comprising:
   providing a substrate;
   forming an inter-metal dielectric (IMD) layer on the substrate extending across a memory region and a logic region;
   forming via openings and trenches in the IMD layer in the memory region;
   forming via openings and trenches in the IMD layer in the logic region;
   filling the via openings and trenches in the memory region and the logic region simultaneously to form a plurality of tower structures with at least one metal interconnect structure in each tower structure in the memory region and to form at least one metal set in the logic region; and
   forming an MTJ structure in the tower structure to connect the metal interconnect structure,
   wherein the metal set comprises a group of metal lines arranged in parallel and a group of metal vias coupled to the metal lines; and
   wherein the metal lines in one metal set are arranged in parallel and extended along a first direction and those in an adjacent metal set are arranged in parallel and extended along a second direction, wherein the angle between the first direction and the second direction is larger than 0° and smaller than 180°.

15. The method of claim 14, wherein the via openings and trenches in the memory region are formed using a dual damascene operation with a chromeless phase lithography (CPL).

16. The method of claim 14, wherein the plurality of tower structures are arranged on the substrate in a XY staggered pattern.

17. The method of claim 16, wherein the pitch between two adjacent tower structures is from about 20 nm to about 300 nm.

18. The method of claim 14, wherein the at least one metal interconnect structure and the magnetic tunnel junction (MTJ) structure in each tower structure are substantially symmetric along a stacking direction.

19. The method of claim 16, wherein the at least one metal interconnect structure and the magnetic tunnel junction (MTJ) structure in each tower structure are substantially symmetric along a stacking direction.

20. The method of claim 14, wherein each metal interconnect structure comprises a metal island and each metal set comprises a group of metal lines arranged in parallel, and a length of the metal island is less than a length of the metal line.

\* \* \* \* \*